(12) United States Patent
Guler et al.

(10) Patent No.: US 11,164,790 B2
(45) Date of Patent: Nov. 2, 2021

(54) INTEGRATED NANOWIRE AND NANORIBBON PATTERNING IN TRANSISTOR MANUFACTURE

(71) Applicant: Intel Corporation, Santa Clara, CA (US)

(72) Inventors: Leonard P Guler, Hillsboro, OR (US); Biswajeet Guha, Hillsboro, OR (US); Mark Armstrong, Portland, OR (US); Tahir Ghani, Portland, OR (US); William Hsu, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 93 days.

(21) Appl. No.: 16/632,319

(22) PCT Filed: Aug. 17, 2017

(86) PCT No.: PCT/US2017/047409
§ 371 (c)(1),
(2) Date: Jan. 17, 2020

(87) PCT Pub. No.: WO2019/035837
PCT Pub. Date: Feb. 21, 2019

(65) Prior Publication Data
US 2020/0176321 A1 Jun. 4, 2020

(51) Int. Cl.
H01L 21/8234 (2006.01)
H01L 21/308 (2006.01)
H01L 27/088 (2006.01)

(52) U.S. Cl.
CPC .. H01L 21/823456 (2013.01); H01L 21/3086 (2013.01); H01L 21/823431 (2013.01); H01L 27/0886 (2013.01)

(58) Field of Classification Search
CPC ............... H01L 21/027; H01L 21/0273; H01L 21/0274; H01L 21/033; H01L 21/0332;
(Continued)

(56) References Cited

U.S. PATENT DOCUMENTS 6,943,405 B2 9/2005 Bryant et al.
2008/0128820 A1* 6/2008 Cho .................. H01L 27/11546
257/368

(Continued)

FOREIGN PATENT DOCUMENTS

KR         100792604         1/2008

OTHER PUBLICATIONS

International Preliminary Report on Patentability from PCT/US2017/047409 dated Feb. 27, 2020, 8 pgs.
(Continued)

Primary Examiner — Cheung Lee
(74) Attorney, Agent, or Firm — Green, Howard & Mughal LLP

(57) ABSTRACT

Fabrication of narrow and wide structures based on lithographic patterning of exclusively narrow mask structures. Multi-patterning may be employed to define narrow mask structures. Wide mask structures may be derived through a process-based merging of multiple narrow mask structures. The merge may include depositing a cap layer over narrow structures, filling in minimum spaces. The cap layer may be removed leaving residual cap material only within minimum spaces. Narrow and wide structures may be etched into an underlayer based on a summation of the narrow mask structures and residual cap material. A plug pattern may further mask portions of the cap layer not completely filling space between adjacent mask structures. The underlayer may then be etched based on a summation of the narrow mask structures, plug pattern, and residual cap material.

(Continued)

Such methods may be utilized to integrate nanoribbon transistors with nanowire transistors in an integrated circuit (IC).

21 Claims, 19 Drawing Sheets

(58) Field of Classification Search
CPC . H01L 21/0334; H01L 21/302; H01L 21/306; H01L 21/308; H01L 21/3083; H01L 21/3086; H01L 21/32; H01L 21/8232; H01L 21/823431; H01L 21/823437; H01L 21/823456; H01L 21/823821; H01L 21/823828; H01L 21/82385; H01L 27/085; H01L 27/088; H01L 27/0886; H01L 27/092; H01L 27/0924; H01L 29/41; H01L 29/413; H01L 29/4232; H01L 29/42372; H01L 29/42376; H01L 29/42384; H01L 29/42392; H01L 29/66477

See application file for complete search history.

(56) References Cited

U.S. PATENT DOCUMENTS

| | | |
|---|---|---|
| 2015/0194419 A1 | 7/2015 | Singh et al. |
| 2016/0225634 A1 | 8/2016 | Anderson et al. |
| 2017/0178963 A1 | 6/2017 | Weybright et al. |
| 2017/0207216 A1 | 7/2017 | Peng et al. |

OTHER PUBLICATIONS

International Search Report and Written Opinion for International Patent Application No. PCT/US2017/047409 dated Feb. 26, 2018.

* cited by examiner

INTEGRATED NANOWIRE AND NANORIBBON PATTERNING IN TRANSISTOR MANUFACTURE

CLAIM OF PRIORITY

This Application is a National Stage Entry of, and claims priority to, PCT Application No. PCT/US2017/047409, filed on Aug. 17, 2017 and titled "INTEGRATED NANOWRIE & NANORIBBON PATTERNING IN TRANSISTOR MANUFACTURE", which is incorporated by reference in its entirety for all purposes.

BACKGROUND

Device density in integrated circuits (ICs) continues to increase. Within the shrinking device footprint, vertical transistor orientations are becoming more important. Vertically oriented transistor architectures, such as nanowire transistor stacks for example, may become the basic transistor cell design of an IC. The number of channel layers within a nanowire material stack and the lateral width of each nanowire may set the current carrying width of a nanowire transistor. Transistors having a given number of channel layers may therefore have a larger current carrying width if patterned to have a larger lateral width. A transistor with a footprint larger than that of a nanowire transistor may be referred to as a nanoribbon transistor.

A nanoribbon transistor, associated with a given lateral width, may be integrated with a nanowire transistor that is associated with some lateral width smaller than the nanoribbon transistor, for example to provide a circuit designer with a menu of transistor metrics that includes different current carrying widths. However, the inclusion of nanoribbon transistors may complicate the transistor patterning process. For example, if the transistor polygons imaged during a lithography operation become less uniform because wide polygons for nanoribbon transistors are interspersed among narrow polygons for nanowire transistors, ultimate resolution of the patterning process may suffer, thereby limiting the minimum feature size achievable for nanowire transistors.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements. In the figures.

DETAILED DESCRIPTION

Figure 1:
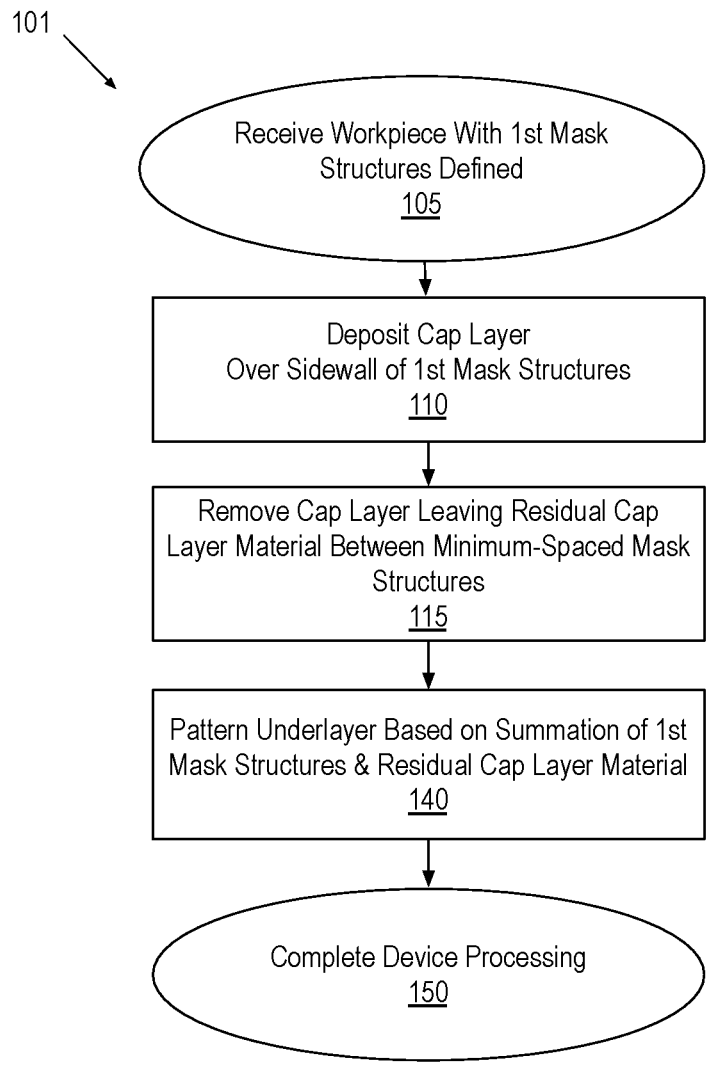
FIG. 1 is a flow diagram illustrating non-selective methods of fabricating wide structures alongside narrow structures, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Methods and architectures associated with patterning structures of an IC are described below. In some exemplary embodiments, methods are applied toward the fabrication of fin structures in one or more semiconductor layers. Such fin structures may, for example, define the geometry of one or more portions of a transistor, such as a transistor channel. In some embodiments, methods are applied toward the integration of wide structures (e.g., fins with a large lateral width suitable for a nanoribbon transistor geometry) with narrow structures (e.g., fins with a small lateral width suitable for a nanowire transistor geometry). Some such embodiments may advantageously enable the formation of wide structures without any lithographic mask patterning beyond that utilized for narrow structures. Lithographic patterning techniques may then be optimized for exclusively narrow structures, some of which may be merged through further processing to fabricate structures having a range of footprints (e.g., many different lateral widths).

With the methods and techniques described herein, an IC fabrication process may accommodate a menu of feature geometries with attendant performance characteristics. For exemplary nanowire/nanoribbon embodiments different current-carrying transistor channel widths may be accommodated, thereby offering greater flexibility in IC design. With the methods and techniques described herein, an IC fabrication flow may aggressively scale narrow structure geometry without concern for wider structures. For example, techniques such as multi-patterning with a pitch halving (P/2), or pitch quartering (P/4) may be tailored exclusively for a target lateral width associated with a narrow mask structure. With the methods and techniques described herein, wide mask structures may be subsequently derived through a process-based merging of multiple narrow mask structures. Such a merging process may be completely maskless, requiring no additional lithography operations to generate wide mask structures from narrow mask structures. Alternatively, the merging process may be made selective through the use of a plug mask to supplement the process-based merging of mask structures. One or more of these techniques may be practiced in accordance with embodiments further described herein.

Some embodiments described below also illustrate structural features indicative of fabrication processes applying the principles taught herein. Hence, while some mask structures described herein may be ephemeral, final structures in the IC that may provide a lasting fingerprint of the fabrication process are highlighted in the description below. For example, nanoribbon transistors fabricated as described below may have periodic detents at ends of one or more semiconductor layer while such detents are absent from nanowire transistors. These detents, which may be visible with top-down scanning electron microscopy (SEM), are indicative of merging multiple narrow mask structures into a wide mask structure that ultimately defines one or more semiconductor layer of the nanoribbon transistor. As another example, all nanoribbon transistors may have lateral widths that are a multiple of the nanowire transistor lateral width summed with a multiple of a predetermined distance between narrow mask structures that is filled during the mask merging process. As such, within an IC, all nanoribbons will have lateral widths that vary by an integer multiple of a discrete increment that is equal to the sum of the predetermined distance and the nanowire lateral width. The predetermined distance filled during the narrow mask structure merge is less than the spacing between adjacent transistors, which is not filled during the narrow mask structure merge. Hence, a number of structural indications of the fabrication techniques described herein may be identified within a single resultant structure. There are also a number of relationships within populations of resultant structures that are indicative of the fabrication techniques described herein.

FIG. 1 is a flow diagram illustrating non-selective methods 101 for fabricating wide structures alongside narrow structures, in accordance with some embodiments. Methods 101 illustrate non-selective embodiments of a narrow mask structure merging process. In methods 101, any mask structures that are in sufficient proximity are ultimately merged into a larger mask structure. Structures that are not to be merged are spaced apart by more than a threshold distance that is predetermined for a specific implementation of methods 101. Once merged, the resultant mask structures are then translated, alongside the unmerged mask structures, into some target device layer.

In FIG. 1, methods 101 begin at operation 105 where a workpiece is received. The workpiece may be any known to be suitable for subsequent processing. In some exemplary embodiments, the workpiece is any known to be suitable for IC manufacture. In some such embodiments, the workpiece received at operation 105 includes a crystalline semiconductor substrate, such as but not limited to, a crystalline silicon wafer. The workpiece received at operation 105 includes a first mask layer having first mask structures, and one or more underlayer that is to be subsequently patterned based, at least in part, on the first mask structures. The first mask structures may be of any material suitable as a mask for a subsequent patterning process. Exemplary materials include carbon-based hardmask materials (CHM), silicon oxides (SiO), silicon nitrides (SiN), silicon carbides, (SiC), carbon-doped oxides (SiOC(H)). Other materials, including metals, such as, but not limited to, TiN, may also be employed. The underlayer may be part of a substrate (e.g., crystalline semiconductor), or may be any suitable thin film such as, but not limited to, one or more dielectric material layers, metal layers, or semiconductor layers (crystalline or otherwise).

The first mask structures received at operation 105 include structures of a first lateral width (i.e., in the plane of the workpiece). In some embodiments, the first mask structures include "narrow" mask structures that have a "minimum lateral width" that is in name only (nominal), as individuals structures with this minimum lateral width will not necessarily have exactly the same actual lateral widths. Narrow mask structure having the nominal minimum lateral width are of the same class of structures targeting some same minimum lateral width. In some embodiments, a vast majority, if not all, of the first structures are narrow mask structures having substantially the same actual minimum lateral width with some distribution about the target minimum lateral width as a result of process tolerances. As used herein, the qualifier "substantially" is employed in the recognition that manufacturing processes output a population characterized by some distribution statistics. In this context, a vast majority, if not all, of the first mask structures received at operation 105 are narrow mask structures having the target minimum lateral width +/−10% of that target minimum lateral width. These first mask structures may further have any lateral length to occupy any footprint over the workpiece, as embodiments herein are not limited in this context. In some exemplary embodiments, these first mask structures have a wide range of lateral lengths.

The mask structures received at operation 105 may have been defined using any suitable techniques. For example, one or more lithographic processes (e.g., extreme UV) and/or subtractive processes (e.g., hardmask etching) and/or additive processes (e.g., thin film deposition) may have been practice upstream of methods 101 to generate the first mask structures received at operation 105. In some embodiments, the first mask structures received at operation 105 are generated by a multi-patterning processes, such as, but not limited to, pitch-quartering. Such techniques may achieve a target minimum lateral width of 10 nm, or less, for example. Lateral spacing between these first mask structures may be more or less than the target lateral width of the structures. In some embodiments, the mask structures received at operation 105 may be separated into two populations: one in which adjacent mask structures are spaced apart by no more than a threshold distance or spacing; and another in which adjacent mask structures are spaced apart by more than the threshold distance or spacing. The threshold distance or spacing is predetermined and is the threshold at which merging of these first mask structures will occur. All mask structures spaced apart by more than the threshold distance will remain separate from their nearest neighboring mask structures. Although the threshold spacing may vary with implementation, in some exemplary embodiments that threshold spacing is 10-20 nm.

Methods 101 continue at operation 110 where a cap layer is deposited over the first mask structures. The cap layer may be any material known to be suitable as a mask material compatible with subsequent processing. The cap layer may advantageously be of a material that can be removed selectively (i.e., at a higher rate) relative to the first mask structures and relative to the underlayer(s) to be subsequently etched. The cap layer may be deposited with any technique known to be suitable for the material. In some advantageous embodiments, the cap layer is deposited by a conformal process such that the thickness of the cap layer along a sidewall of the first mask features is approximately the thickness of the cap layer within spaces between the first mask structures that exceed the threshold distance. In some exemplary embodiments, the thickness of the cap layer deposited over the sidewalls of the first mask structures is at least one-half the threshold distance (e.g., 5-10 nm). For such embodiments, spaces between the first mask structures that are less than the threshold distance will be occupied by cap layer material that traverses the adjacent sidewalls of multiple first mask structures. Where the thickness of the cap layer is sufficient, the cap layer material surface closes onto itself within the sub-threshold spaces. Hence, within these sub-threshold spaces, the effective thickness of the cap layer is a function of the height of the first mask structures rather than the target deposition thickness of the cap layer. Within spaces that exceed the threshold distance, the cap layer does not close onto itself and at least a portion of the first mask structures and/or underlayer will be covered by only the nominal cap layer thickness. In some embodiments where the height of the first mask features exceeds the deposition thickness of the cap layer, the effective thickness of the cap layer within the sub-threshold spaces is greater than the thickness of the cap layer covering mask features that are spaced apart by distances larger than the threshold distance.

Methods 101 continue at operation 115 where the cap layer is removed in a manner that leaves residual cap layer material between the sub-threshold spaces (i.e., minimum-spaced mask structures). In exemplary embodiments, the cap layer is removed at operation 115 with an etch that targets the nominal thickness of the cap layer (with suitable over etch) to expose surfaces of the workpiece that are covered with only the nominal cap layer thickness. During operation 115, cap layer material within the sub-threshold spaces is not completely removed because of its greater effective thickness. For some exemplary embodiments where the cap layer is removed with an isotropic etch process, sidewalls of the first mask structures that are spaced apart by more than the threshold distance will be exposed. In other words, a spacer of the cap layer material is not formed adjacent to any of first mask structures that are spaced apart from their neighbors by more than the threshold distance. Hence, the original lateral width of the first mask features is recovered for those mask structures that are spaced apart from their neighbors by more than the threshold distance. Narrow mask structures received at that are spaced apart from their neighbors by more than the threshold distance are retained at operation 115. Narrow mask structures that are spaced apart from their neighbors by less than the threshold distance are now interconnected across these sub-threshold spaces by cap layer residue left after the etch operation.

Methods 101 continue at operation 140 where the underlayer(s) are patterned based on a summation of the first mask structures and residual cap layer material. Operation 140 may entail any etch process that is known to be suitable for removing unmask portions of the underlayer(s). In some embodiments, an anisotropic etch having suitable selectively over the underlayer(s) relative to both the first mask structures and the cap layer residue may be employed at operation 140 to remove removing portions of the underlayer(s) not masked by either the first mask structures or the cap layer residue. The resulting structures so fabricated in the underlayer(s) can include narrow structures that were masked by narrow mask structures spaced apart from their nearest neighbors by more than the threshold distance. The resulting structures so fabricated in the underlayer(s) can further include wide structures that were masked by both narrow mask structures that were spaced apart from their nearest neighbors by less than the threshold distance and cap layer residue that remained within the sub-threshold spaces. Methods 101 then complete at operation 150 where the structures generated at operation 140 may be further processed according to any techniques known to be suitable for fabricating any known device.

Figure 2:
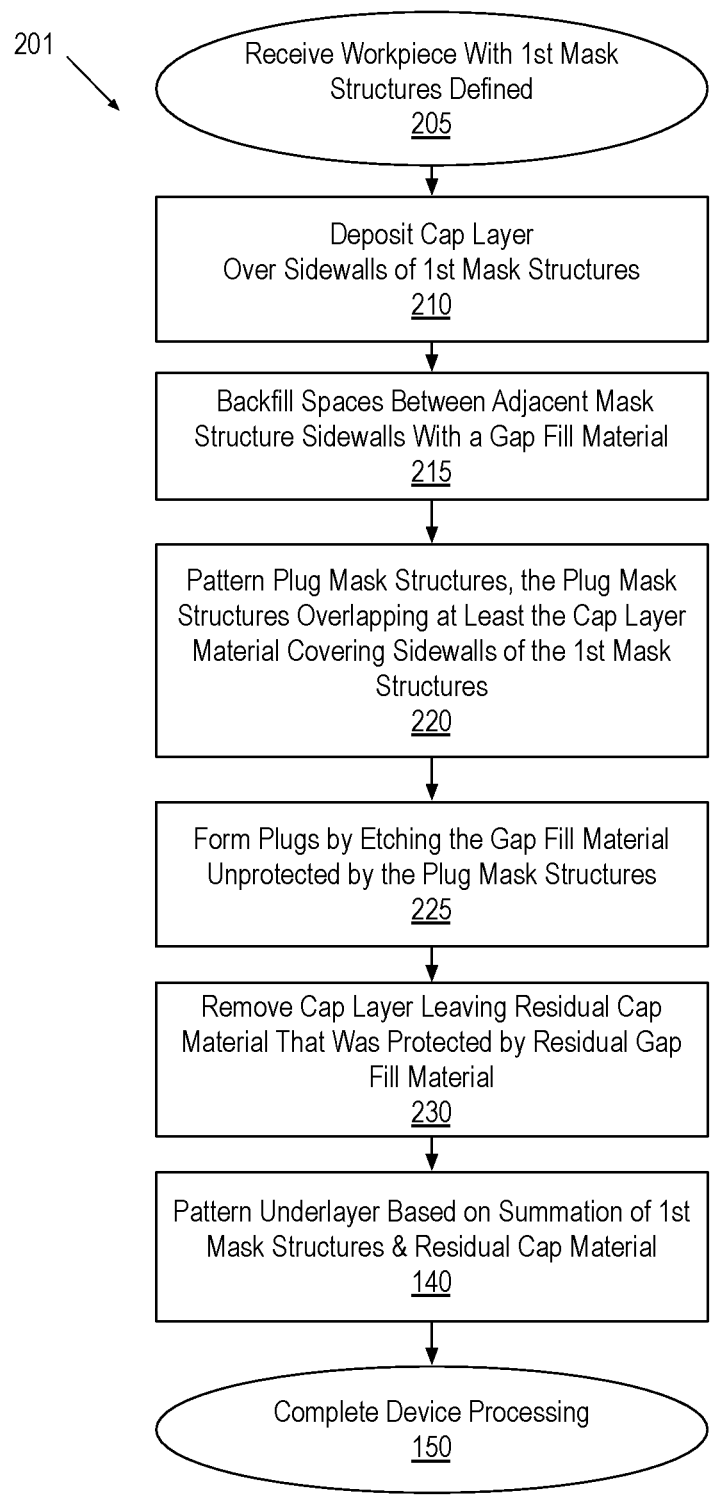
FIG. 2 is a flow diagram illustrating selective methods of fabricating wide structures alongside narrow structures, in accordance with some embodiments.

FIG. 2 is a flow diagram illustrating selective methods 201 for fabricating wide structures alongside narrow structures, in accordance with some embodiments. Methods 201 illustrate embodiments of a selective narrow mask structure merging process. In contrast to methods 101 where the merging of mask structures is a function of their spacing, methods 201 enable selective merging of some, rather than all, minimum-spaced mask structures. In methods 201, rather than inducing a merge of mask structures, a cap layer temporarily enlarges the footprint of the mask structures facilitating registration of a subsequent plug mask. For mask structures that are to be merged, the plug mask pattern is then employed as a means of selectively protecting some of the cap layer material during subsequent removal of the cap layer. For mask structures that are not to be merged, the cap layer is removed to recover the minimum lateral width of each narrow mask structure. Once merged, the resultant mask structures are then translated into some target layer alongside the unmerged mask structures.

In FIG. 2, methods 201 begin at operation 205 where a workpiece is received. The workpiece may be any of those suitable for methods 101, as described above. The workpiece received at operation 205 again includes a first mask layer having first mask structures, and one or more underlayer that is to be subsequently patterned based, at least in part, on the first mask structures. The underlayer(s) may again be part of a substrate (e.g., crystalline semiconductor), or may be any suitable thin film(s) such as, but not limited to, dielectric material layers, metal layers, or semiconductor layers (crystalline or otherwise). The first mask structures may also be of any material suitable as a mask for a subsequent patterning of the underlayer(s). For example, any of the materials listed above may be suitable for the first mask structures.

The first mask structures received at operation 205 include narrow mask structures of some nominal minimum lateral width. In some embodiments, a vast majority, if not all, of the first structures are narrow mask structures having substantially the minimum lateral width. These first mask structures may further have any lateral length to occupy any footprint over the workpiece, as embodiments herein are not limited in this context. In some exemplary embodiments, these first mask structures have a wide range of lateral lengths.

The mask structures received at operation 205 may have been defined using any suitable techniques. For example, one or more lithographic processes (e.g., extreme UV) and/or subtractive processes (e.g., hardmask etching) and/or additive processes (e.g., thin film deposition) may have been practice upstream of methods 201 to generate the first mask structures received at operation 205. In some embodiments, the first mask structures received at operation 205 are generated by a multi-patterning processes, such as, but not limited to, pitch-quartering. Lateral spacing between these first mask structures may be more or less than the lateral width of the mask structures. All the mask structures received at operation 205 have at least a minimum distance or spacing. Some mask structures may also be spaced apart by more than this minimum spacing. As described further below, absent some supplementation by a plug mask, all of the first mask structures that spaced apart by the minimum spacing will remain separate from their nearest neighboring mask structures.

Methods 201 continue at operation 210 where a cap layer is deposited over the first mask structures. The cap layer may be any material known to be suitable as a mask material compatible with subsequent processing. The cap layer may be of a material that can be removed selectively (i.e., at a higher rate) relative to the first mask structures and relative to one or more of the underlayer(s) to be subsequently etched. The cap layer may be deposited with any technique known to be suitable for the material. In some advantageous embodiments, the cap layer is deposited by a conformal process such that the thickness of the cap layer along a sidewall of the first mask features is approximately the thickness of the cap layer within a least a portion of the minimum spacing between adjacent ones of the first mask structures. Hence, in contrast to methods 101 (e.g., operation 110), the cap layer deposited at operation 210 is not sufficiently thick to fold back on itself within a minimally spaced pair of mask structures. Within spaces of at least the minimum, the cap layer will be only the nominal cap layer thickness. The footprint of each of the first mask structures is however effectively enlarged by the cap layer. For example, the minimum lateral width of a narrow mask structure will grow by approximately twice the thickness of the cap layer deposited on the mask structure sidewall.

Methods 201 continue at operation 215 where spaces between adjacent mask structures (as covered with the cap layer) are backfilled with a gap fill material. This gap fill material may be of any composition that is also suitable as a mask material for subsequent processing of the underlayer(s). Examples include organic and inorganic dielectric materials. In some exemplary embodiments, the gap fill material is deposited with planarizing processes, such as, but not limited to, spin-on techniques. With the first mask structures now planarized within the gap fill material, methods 201 continue at operation 220 where plug mask structures are patterned, for example within a mask stack including a photosensitive material layer that is lithographically patterned with electromagnetic radiation (e.g., extreme UV, etc.). The plug mask structures are to be aligned relative to the first mask structures. Enlargement of the first mask structures through application of the cap layer may relax the overlay/misregistration tolerances associated with the plug mask process. For example, the plug mask need only overlap spaces between adjacent ones of the first mask structures, and the cap layer has reduced these spaces to below the minimum spacing of the first mask structures.

At operation 225, plugs between adjacent ones of the first mask structures that are ultimately be merged are formed by removing the gap fill material unprotected by the plug mask structures. In some embodiments, the gap fill material is removed with an etch process that is selective to the gap fill material relative to the cap layer. In some embodiments, the gap fill material is removed with an etch process that includes an anisotropic phase to translate the plug pattern into the gap fill material, retaining some of the gap fill material underlying the plug mask structures. In some further embodiments, the gap fill material is removed with an etch process that includes an isotropic phase to remove gap fill material from edges of the cap layer traversing sidewalls of the first mask structures.

Methods 201 continue at operation 230 where the cap layer is removed in a manner that leaves residual cap layer material only where it is protected by residual gap fill material. In exemplary embodiments, the cap layer is removed at operation 115 with an etch that targets the nominal thickness of the cap layer (with suitable over etch) to expose surfaces of the workpiece that were covered with only the nominal cap layer thickness. Cap layer material protected by the gap fill material is not completely removed because of its greater effective thickness. For some exemplary embodiments where the cap layer is removed at operation 115 with an isotropic etch process, sidewalls of the first mask structures that are not protected by the gap fill material will be exposed. In other words, a spacer of the cap layer material is not formed adjacent to any of first mask structures that are not merged with their nearest neighbors by the back fill material. Hence, the original lateral width of the first mask features is recovered for those mask structures that have no edge protected by both the cap layer and backfill material while the cap layer is retained between adjacent narrow mask structures that had at least their nearest sidewalls covered by the gap fill material.

Methods 201 continue at operation 140 where the underlayer(s) is patterned based on a summation of the first mask structures and residual cap layer material. Since the location of the cap layer residue is a further function of where gap fill material was retained, the underlayer(s) may be considered to be patterned based on a summation of the first mask structures, cap layer residue, and gap fill residue (plug structures). Operation 140 may entail any etch process that is know to be suitable for removing unmasked portions of the underlayer(s). In some embodiments, an anisotropic etch having suitable selectively to the underlayer(s) relative to the first mask structures and to the cap layer residue is employed at operation 140 to remove portions of the underlayer(s) not masked by the first mask structures or the cap layer residue. The resulting structures so fabricated in the underlayer(s) can therefore include narrow structures that were masked by narrow mask structures recovered from the mask structure merge. The resulting structures so fabricated in the underlayer(s) can further include wide structures that were masked by the narrow mask structures and by cap layer residue that remained as protected by the gap fill residue. Methods 201 then complete at operation 150 where the structures generated at operation 140 may be further processed according to any techniques known to be suitable for fabricating any known device.

Methods 101 and 201 are described further below in the specific context of nanoribbon and nanowire transistors for the sake of clearly conveying various aspects of the methods and highlighting structures indicative of practicing the methods. However, methods 101 and 201 may also be readily applied toward the fabrication of other IC structures. For example, methods 101 and 201 are applicable to fabricating transistor terminals (e.g., gate electrodes) of differing geometries, fabricating interconnect metallizations (e.g., metal-1 lines) of differing geometries, or the like. It is understood that the skilled artisan should be able to apply methods 101 and 210 to any of these applications based on the nanoribbon and nanowire transistor embodiments described below.

FIGS. 3A, 4A, 5A, 6A, 7A and 8A are plan views of an IC structure 300 including both nanoribbon transistors and nanowire transistors evolving as operations in the methods 101 are practiced, in accordance with some embodiments. FIGS. 3B, 4B, 5B, 6B, 7B and 8B are cross-sectional views of IC structure 300 evolving as operations in the methods 101 are practiced, in accordance with some further embodiments.

Figure 3A:
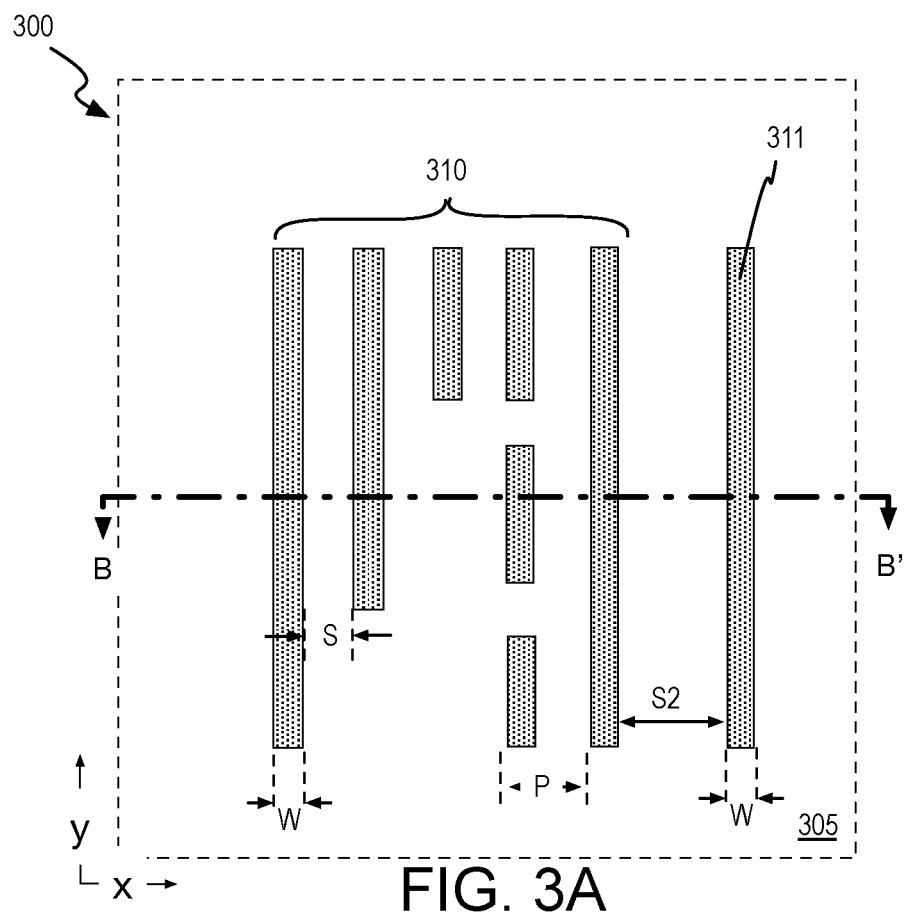
FIGS. 3A, 4A, 5A, 6A, 7A and 8A are plan views of an IC structure including both nanoribbon transistors and nanowire transistors evolving as operations in the methods illustrated in FIG. 1 are practiced in accordance with some embodiments.

Referring first to FIG. 3A, IC structure 300 includes a fin mask pattern formed in a first mask layer. IC structure 300 may be received as an input to methods 101 (FIG. 1), for example. As shown in FIG. 3A, the fin mask pattern has first mask structures including fin masks 310 that have a target minimum lateral width W, within the x-y plane of the workpiece. The minimum lateral width W may vary, but in some exemplary embodiments is approximately 10 nm, or less. Adjacent fin masks 310 are separated from each other by a target minimum lateral spacing S. The spacing S may vary, but in some exemplary embodiments where the W is approximately 10 nm, spacing S is 15-20 nm. The minimum lateral width W and minimum lateral spacing define a target minimum pitch P associated with the fin pattern. The illustrated fin mask pattern further includes a fin mask 311 that also has the minimum lateral width W, but is spaced apart from an adjacent fin mask 310 by spacing S2. As shown, spacing S2 is larger than spacing S. The spacing S2 may vary, but in some exemplary embodiments the spacing S2 is larger than a predetermined threshold distance while S is no more than the threshold distance. In some exemplary embodiments, where S is 15-20 nm, S2 is greater than 20 nm.

Figure 3B:
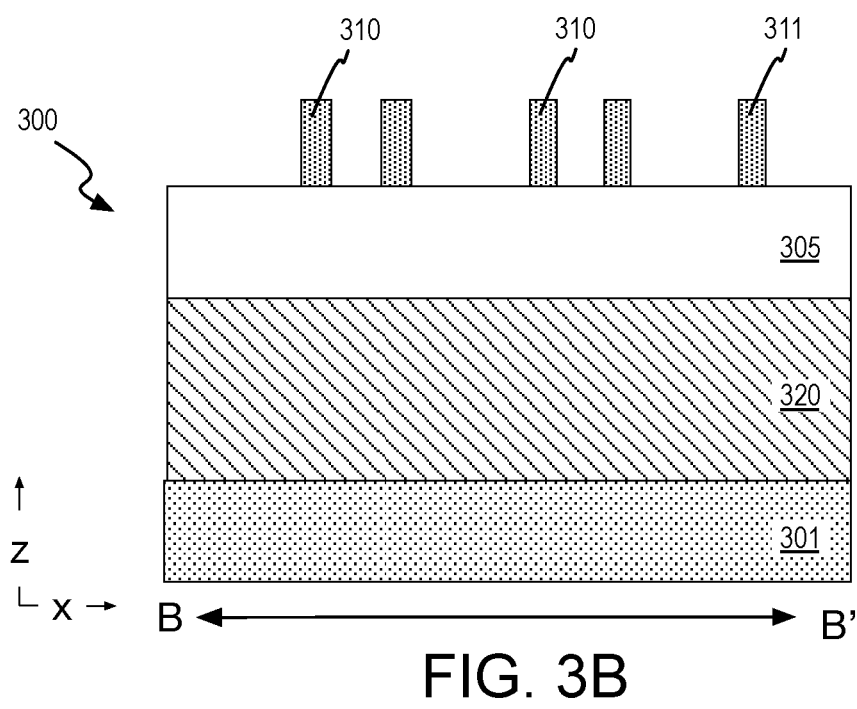
FIGS. 3B, 4B, 5B, 6B, 7B and 8B are cross-sectional views of an IC structure including both nanoribbon transistors and nanowire transistors evolving as operations in the methods illustrated in FIG. 1 are practiced, in accordance with some embodiments.

FIG. 3B further is a cross-sectional view of structure 300 along the B-B' line denoted in FIG. 3A. As show in FIG. 3B, fin masks 310, 311 extend above underlayers that include an interfacial layer 305, and one or more layers of semiconductor material 320. Fin masks 310, 311 may have any composition suitable as a mask for etching one or more of the underlayers. In some embodiments, fin masks 310, 311 are a dielectric material such as, but not limited to SiN, $SiO_x$, SiON, HSQ, MSQ, or carbon alloys (e.g., SiOC(H)). Interfacial layer 305 may have any composition suitable as an adhesion layer, and/or suitable as a hardmask. In some exemplary embodiments, interfacial layer 305 has a composition different than that of fin masks 310, 311. In some such embodiments, interfacial layer 305 is a dielectric such as, but not limited to SiN, $SiO_x$, SiON, HSQ, MSQ, or carbon alloys (e.g., SiOC(H)).

Semiconductor material 320 may include one or more layers that may have any composition suitable for the fabrication of an IC device. In some embodiments, semiconductor material 320 includes one or more layers of semiconductor material suitable for a FET of a first conductivity type (e.g., N-type or an NMOSFET). In some embodiments, semiconductor material 320 includes one or more layers of semiconductor material suitable for a FET of a second, complementary, conductivity type (e.g., P-type or a PMOSFET). In some embodiments, semiconductor material 320 includes one or more layers of a Group IV semiconductor (e.g., silicon, germanium, or alloy there of), or a Group III-V binary, ternary or quaternary semiconductor (e.g., having a first sub-lattice of at least one element from Group III of the periodic table, such as Al, Ga, or In, and a second sub-lattice of at least one element from Group V of the periodic table, such as P, As or Sb). In other embodiments, semiconductor material 320 includes one or more layers of a Group III-N binary, ternary or quaternary semiconductor (e.g., GaN, AlGaN, InAlGaN). Group II-VI semiconductor layers are also possible, as are transition metal chalcogenides (TMD), and semiconducting metal oxides (e.g., $SnO_x$). Substrate 301 may be any of the semiconductor materials described above, and/or comprise a handle wafer material such as, but not limited to, sapphire, glass, or polymer. In some embodiments, where semiconductor material 320 includes one or more layers of a Group IV semiconductor (e.g., silicon), substrate 301 is also the Group IV semiconductor such that one or more layers of semiconductor material 320 are part of a bulk substrate.

Figure 4A:
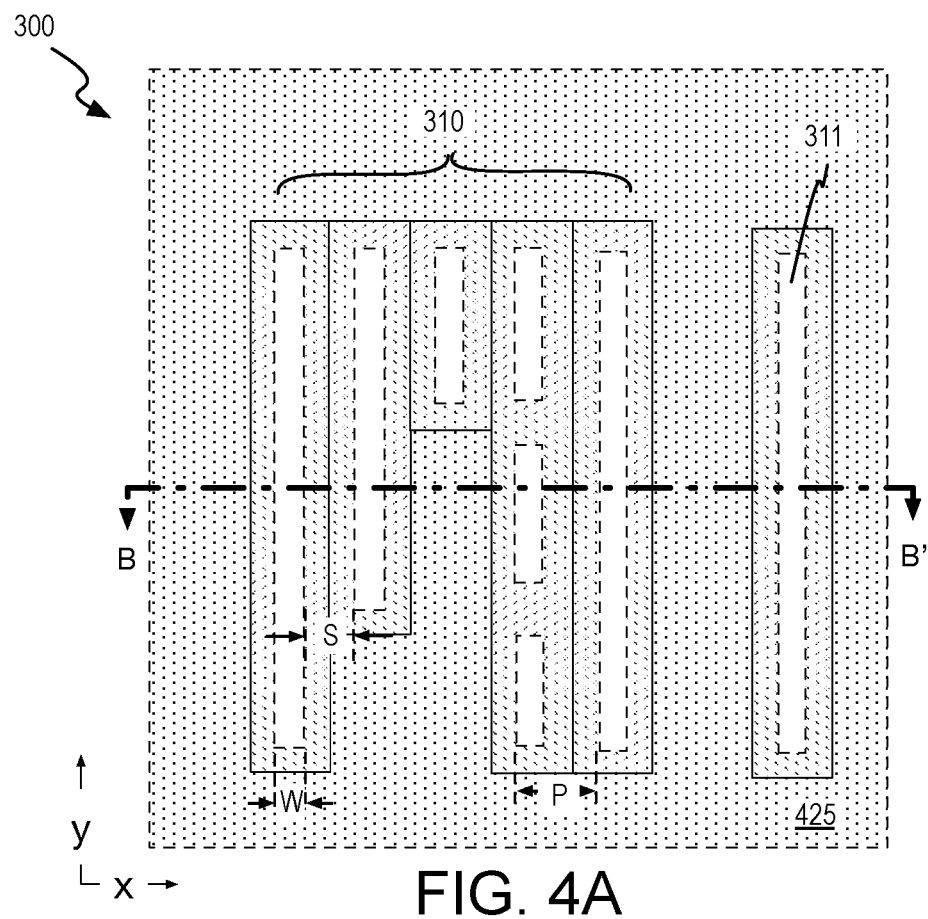
Figure 4B:
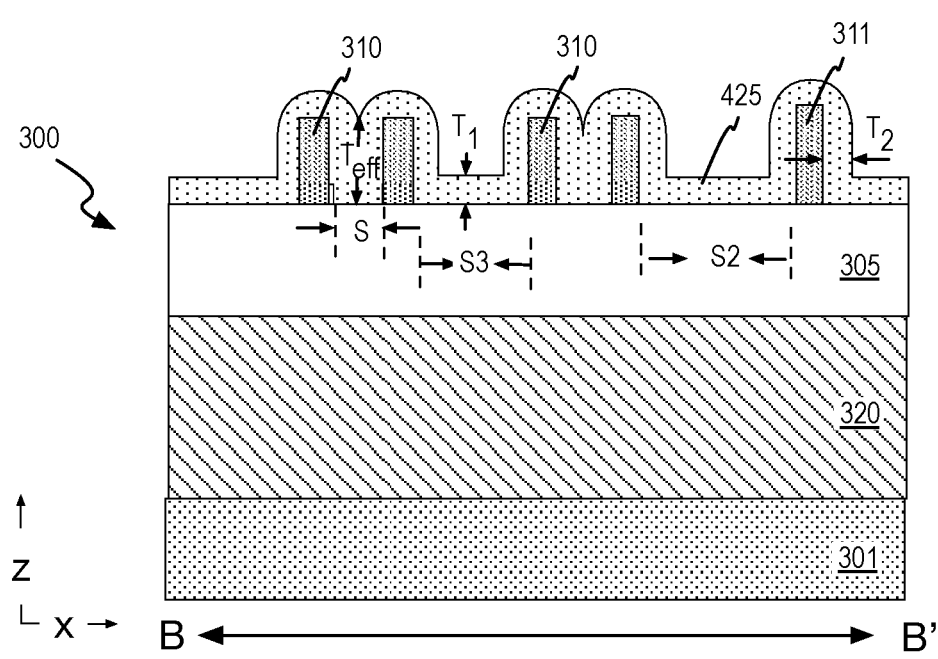

FIGS. 4A and 4B further illustrate a plan and cross-sectional view of IC structure 300 following deposition of a cap layer 425. Cap layer 425 may be deposited at operation 110 during the practice of methods 101 (FIG. 1), for example. Cap layer 425 may be any suitable composition, such as any of those described above. As shown in FIGS. 4A and 4B, cap layer 425 covers fin masks 310, 311 and extends over the underlayers (e.g., contacting intervening layer 305) within the spacing S and spacing S2 between adjacent fin masks 310, 311. As shown in FIG. 4B, cap layer 425 is deposited to a nominal thickness that fills in the spacing S, but does not fill in the spacing S2. Within the spacing S, cap layer 425 is folded back onto itself where there may be a cusp, keyhole or seem. In any event, following cap layer deposition the effective thickness $T_{eff}$ of cap layer 425 within spacing S is significantly greater than the thickness $T_1$ formed within spacing S2. The effective thickness $T_{eff}$ is also greater than the sidewall thickness $T_2$ formed over a sidewall of fin mask 311. The effective thickness $T_{eff}$ of cap layer 425 within spacing S is also greater than the sidewall thickness $T_2$ formed over a sidewall of fin mask 310 that is open to a spacing larger than spacing S (e.g., spacing S3). In some conformal embodiments, sidewall thickness $T_2$ is equal to thickness $T_1$.

Figure 5A:
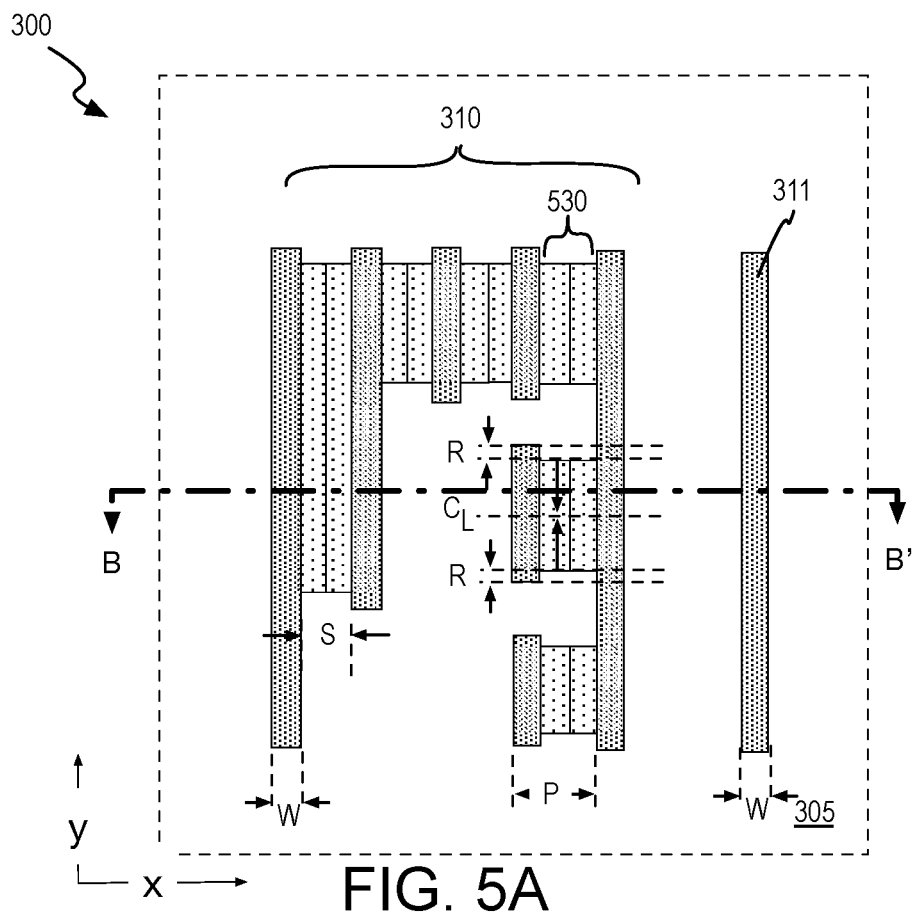
Figure 5B:
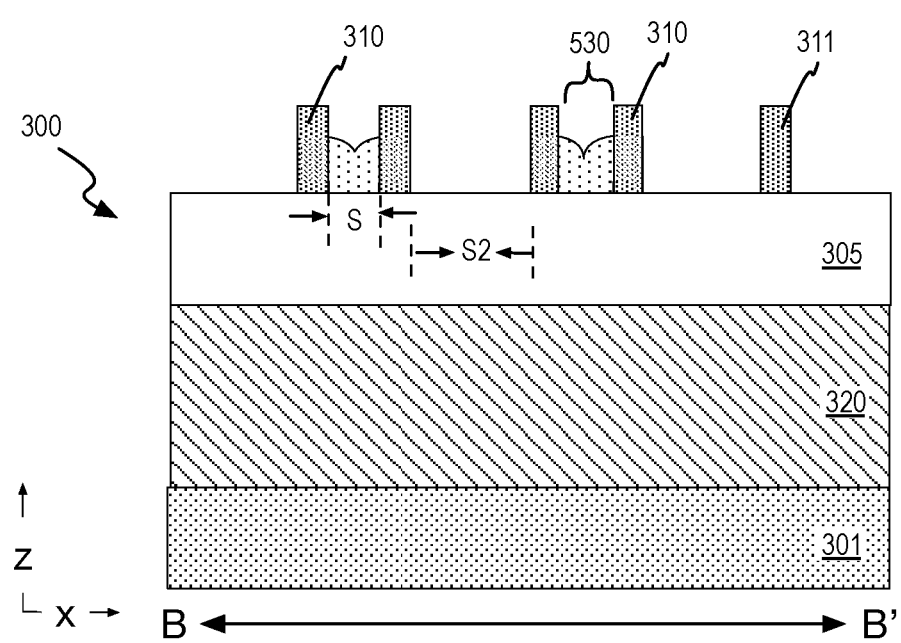

FIGS. 5A and 5B further illustrate a plan and cross-sectional view of IC structure 300 following an etch of cap layer 425. Such a cap layer etch may be performed at operation 115 during the practice of methods 101 (FIG. 1), for example. As shown in FIGS. 4A and 4B, cap layer 425 has been removed everywhere cap layer 425 had a thickness less than $T_{eff}$. The cap layer etch re-exposes the underlayer (intervening layer 305) within spacing S2 by removing the cap material thickness $T_1$. For advantageous embodiments where the cap layer etch includes an isotropic component, the cap layer etch also removes the sidewall thickness $T_2$ formed over a sidewall of fin mask 311, and/or formed over a sidewall of fin masks 310 that is open to a spacing larger than spacing S. Cap layer residue 530 is however retained within the spacing S. As shown in FIG. 5A, cap layer residue 530 connects two adjacent fin masks 310 that were separated by spacing S. In the exemplary embodiment illustrated, cap layer residue 530 suffers a lateral recess R during the cap layer etch. Because of lateral recess R, cap layer residue 530 is pulled back from the ends of fin masks 310. Notably, cap layer residue 530 is self-aligned to fin masks 310. As such, cap layer residue 530 may pull back from both (opposite) ends of fin masks 310 by the same lateral recess R. Cap layer residue 530 is therefore perfectly centered with the transverse centerline $C_L$ of the adjacent fin mask 310 having the shortest lateral length. As further shown in FIG. 5A, the cap layer etch returns fin mask 311 to the minimum lateral width (W).

Figure 6A:
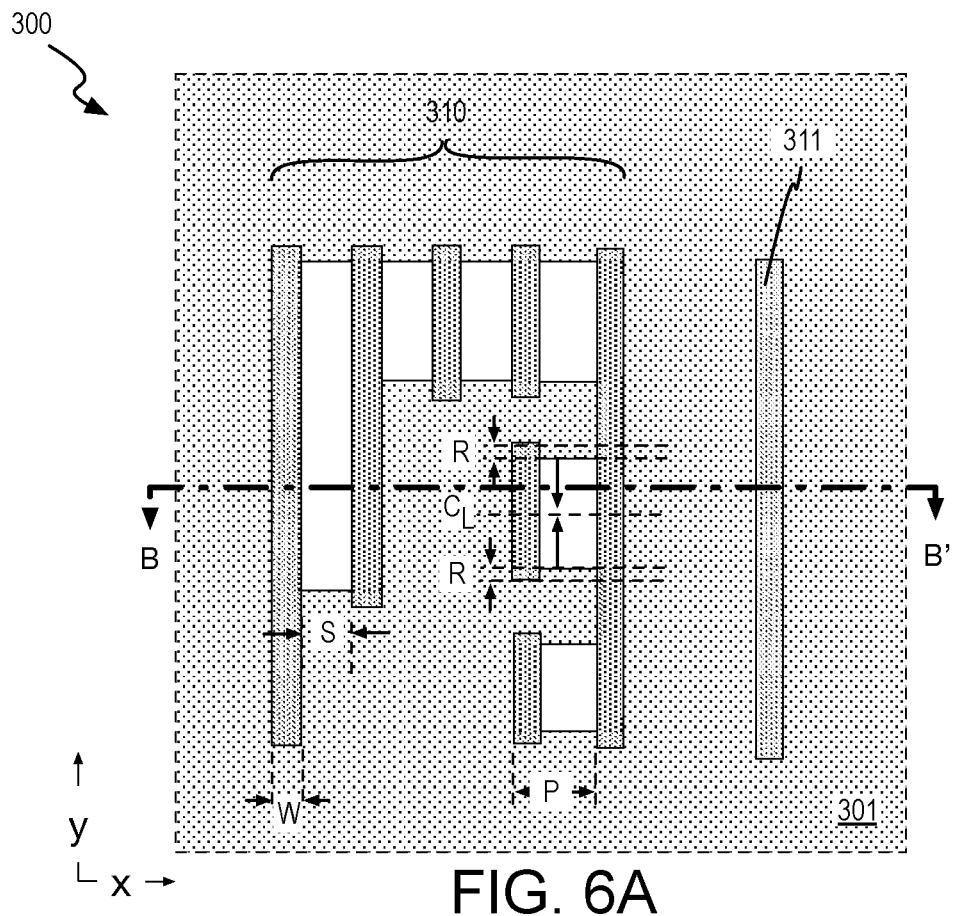
Figure 6B:
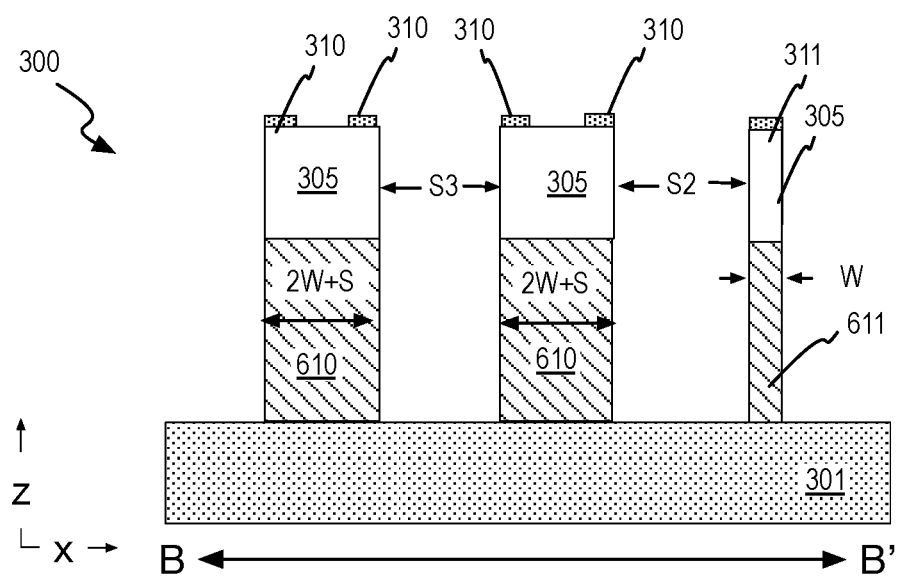

FIGS. 6A and 6B further illustrate a plan and cross-sectional view of IC structure 300 following patterning of the underlayer based on a summation of the fin masks and residual cap layer material (cap residue). Such an etch of the underlayer may be performed at operation 140 during the practice of methods 101 (FIG. 1), for example. As shown in FIGS. 6A and 6B, both intervening layer 305 and semiconductor material 320 has been etched anisotropically. Notably, at some point during the underlayer etch, either or both of cap layer residue 530 and fin masks 310, 311 may be consumed by the etch process. For this reason, intervening layer 305 may be employed as an additional mask layer for the patterning of semiconductor material 320. In the illustrated example, cap layer residue 530 has been completely consumed while a residue of fin masks 310 remains. Of course for some embodiments, there may only be a residue of intervening layer 305 remaining following the etch of semiconductor material 320.

Figure 7A:
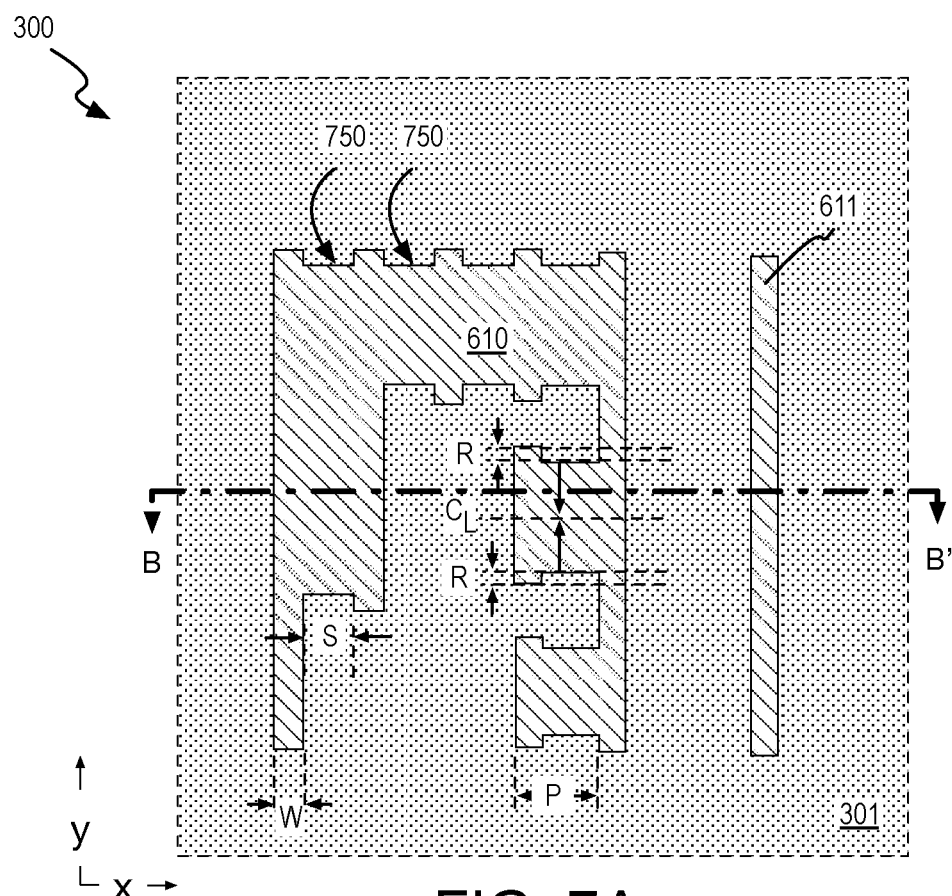
Figure 7B:
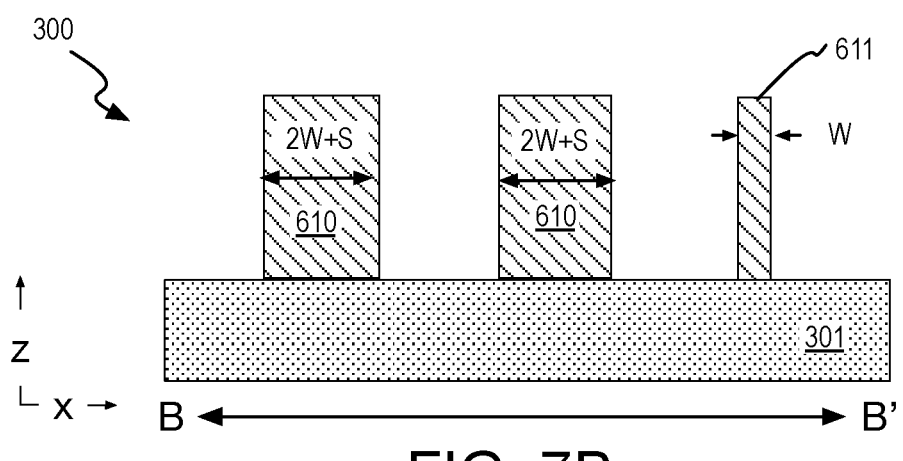

As shown in FIG. 6B, wide fins 610 have outside edges that were defined based on the external edges of two fin masks 310 having the minimum lateral width W. Narrow fin 611 has edges defined based on one fin mask 311 that had the minimum lateral width W. Narrow fin 611 therefore has a minimum lateral width associated with the etch bias (e.g., W for the simplest case where etch bias is zero), while wide fins 610 have a larger lateral width of 2 W+S. FIGS. 7A and 7B further illustrate wide and narrow fins resulting from the merging of narrow fin masks. In FIGS. 7A and 7B, all mask material has been removed, leaving only wide semiconductor fins 610 and narrow semiconductor fin 611. Hence, with sacrificial mask materials removed, IC structure 300 includes wide fins 610 that have a number of detents 750 (visible in the plan view of FIG. 7A) across their lateral width. Detents 750 correspond to the cap layer recesses R. Hence, the number of detents 750 is equal to the number of spaces between fin masks that were merged by the cap layer to mask wide semiconductor fins 610. The spacing between adjacent detents 750 is equal to the minimum lateral width associated with the fin masks (e.g., equal to W). As shown, the spacing between adjacent detents 750 is substantially equal to the lateral width of the isolated narrow fin 611.

Figure 8A:
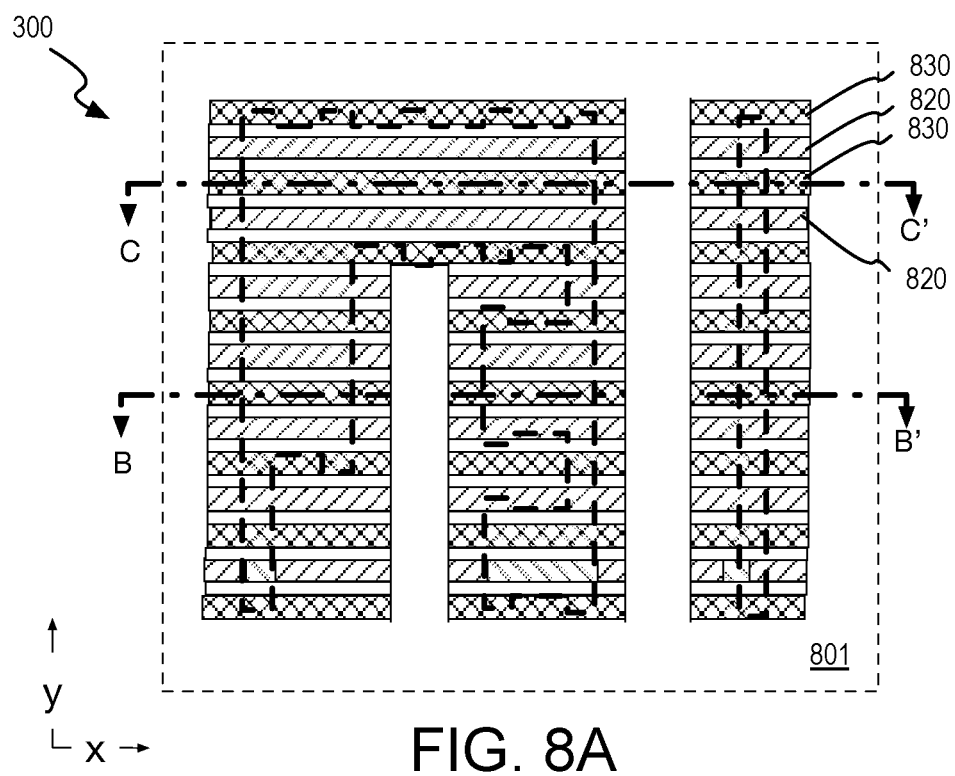
Figure 8B:
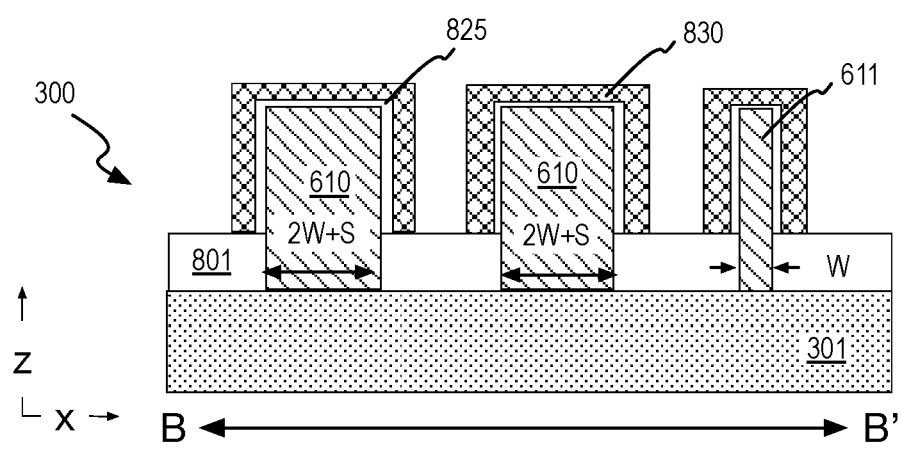

FIGS. 8A and 8B further illustrate a plan and cross-sectional view of IC structure 300 following fabrication of transistor terminals that couple to the wide and/or narrow semiconductor fins. Such terminal fabrication may entail any known process and may be performed as part of operation 150 during the practice of methods 101 (FIG. 1), for example. As shown in FIGS. 8A and 8B, a gate stack including a gate dielectric 825 and a gate electrode 830 extends over at least a sidewall of the narrow and wide fins 610, 611, landing on an isolation (STI) dielectric 801. Gate dielectric 825 may be any material suitable for a MOSFET, including dielectrics having a moderate bulk relative permittivity (e.g., k between 3.5 and 9) or having a high bulk permittivity (e.g., k greater than 9). For example, gate dielectric 825 may include one or more of SiO and SiN. In other examples, gate dielectric 825 may include one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. Gate electrode 830 may, for example, include at least a first work function metal (e.g., N-type work function metal where the finFET is an NMOS device or a P-type work function metal where the finFET is a PMOS device). Exemplary P-type work function metals include, but are not limited to, ruthenium, palladium, platinum, cobalt, nickel, and conductive metal oxides (e.g., ruthenium oxide). Exemplary N-type work function metals include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide).

As shown in FIG. 8A, source and drain metallization 820 has been formed over the narrow and wide fins 610, 611 on opposite sides of gate electrode 830. In the exemplary embodiment, stripes of gate electrode 830 extend over narrow and wide fins 610, 611 adjacent to stripes of source and drain metallization 820. In FIG. 8A, an outline of wide fins 610 are shown in dashed line. As shown, detents at ends of the wide semiconductor fins may be covered by a dummy gate stack. Detents at the ends of wide semiconductor fins may also be buried within isolation dielectric 801 and/or below other structures. Nevertheless, such detents may be identified, for example with a SEM along a focused ion beam cut.

Figure 8C:
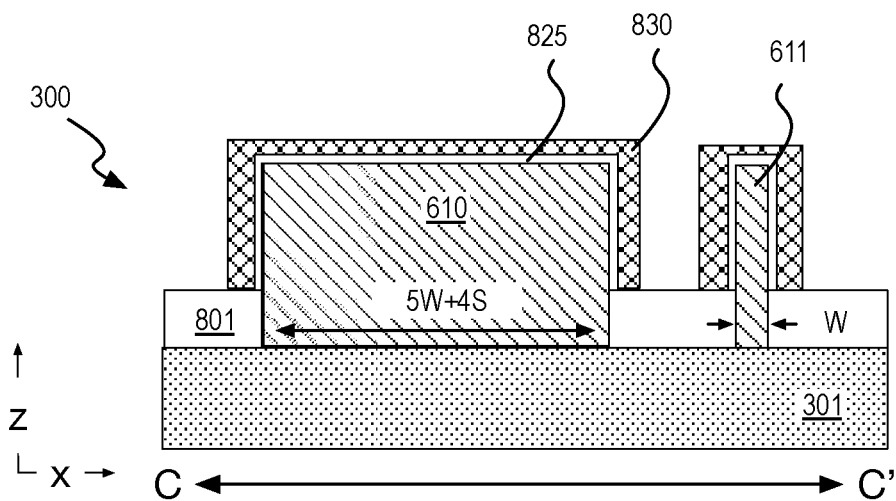
FIG. 8C is a cross-sectional view of an IC structure including both nanoribbon transistors and nanowire transistors, in accordance with some embodiments.

Depending on where gate electrode 830 and source and drain metallization 820 intersect wide fins 610, a transistor may have a range of lateral widths. For example, while the wide fins 610 shown in FIG. 8B have lateral widths of 2 W+S, the wide fin 610 shown in FIG. 8C (cross-section taken along the C-C' line in FIG. 8A) has a lateral width of 5 W+4 S. Noting the techniques employed to fabricate wide fins from merged narrow fin masks, the lateral widths of wide fins can be expected to be an integer multiple of the narrow fin lateral width summed with an integer multiple of the spacing that is merged by the cap layer. The integer multiple of the narrow fin lateral width is at least two. The integer multiple of the spacing is one less than the integer multiple of the narrow fin lateral width (e.g., 2 W+S, 3 W+2 S, 4 W+3 S, 5 W+4 S, etc.). As a further indication of the technique, fins having the minimum lateral width are spaced apart from other fins by more than the spacing S that is merged by the cap layer. Hence, wide fins that are incremented by W+S can be further characterized as incrementing by less than the narrow fin pitch.

Figure 9:
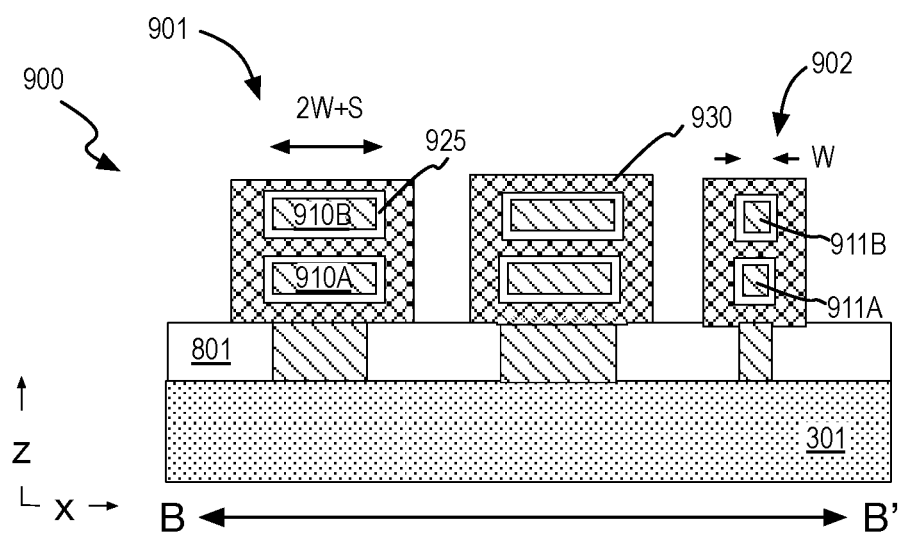
FIG. 9 is a cross-sectional view of an IC structure including both nanoribbon transistors and nanowire transistors, in accordance with some embodiments.

In some further embodiments, nanoribbon transistors are formed from wide semiconductor fins while nanowire transistors are formed from narrow semiconductor fins. FIG. 9 is a cross-sectional view of an IC structure 900 that is fabricated substantially as described above in the context of IC structure 300, however the semiconductor material etched into a fin includes two or more layers of semiconductor material. A sidewall of each layer defines edges of the fin. In addition to being adjacent to a sidewall of the layers of semiconductor material, the gate stack may also extend between two layers of semiconductor material. For example, in FIG. 9, nanoribbon transistor 901 includes two wide fin layers 910A, 910B of a suitable semiconductor material (e.g., Si, Ge, etc.). A gate stack including gate dielectric 925 and gate electrode 930 passes between wide fin layers 910A, 910B (and may further wrap around a channel portion of each layer). Likewise, nanowire transistor 902 includes two narrow fin layers 911A, 911B of a suitable semiconductor material (e.g., Si, Ge, etc.). A gate stack including gate dielectric 925 and gate electrode 930 passes between narrow fin layers 911A, 911B (and may further wrap around a channel portion of each layer).

FIGS. 10A, 11A, 12A, 13A, 14A, 15A, 16A and 17A are plan views of an IC structure 1000 including both wide transistors and narrow transistors evolving as operations in the methods 201 are practiced, in accordance with some embodiments. FIGS. 10B, 11B, 12B, 13B, 14B, 15B, 16B and 17B are cross-sectional views of IC structure 1000 evolving as operations in the methods 201 are practiced, in accordance with some embodiments.

Figure 10A:
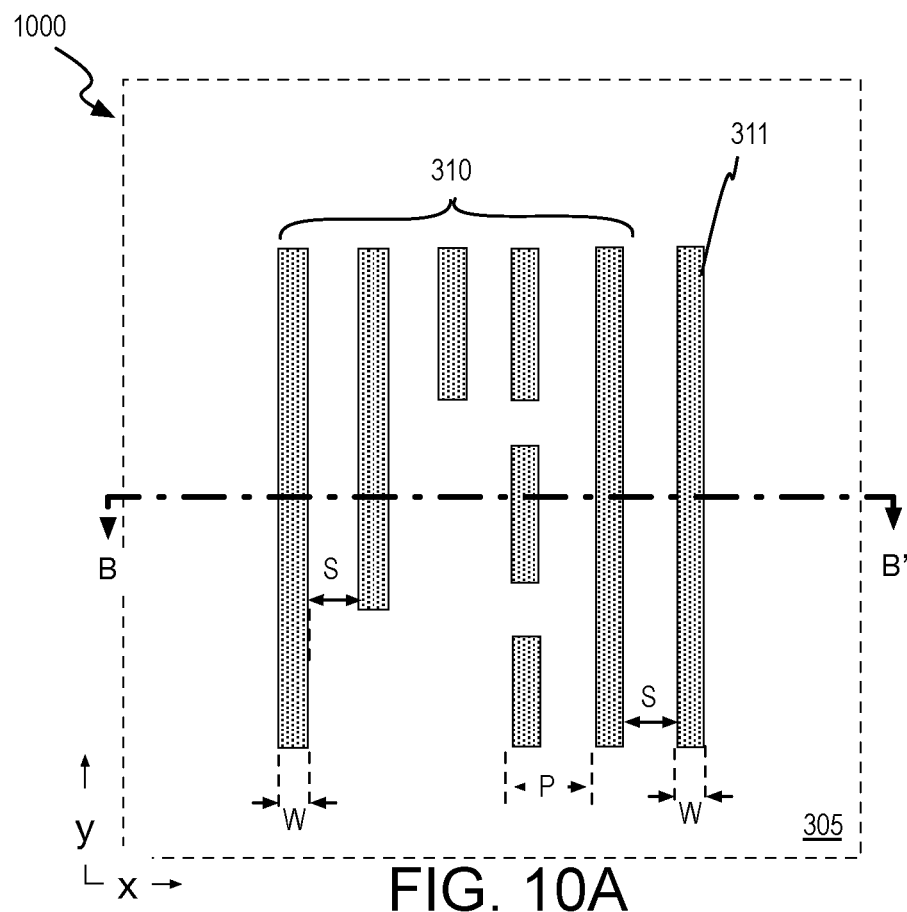
FIGS. 10A, 11A, 12A, 13A, 14A, 15A, 16A and 17A are plan views of an IC structure including both nanoribbon transistors and nanowire transistors evolving as operations in the methods illustrated in FIG. 2 are practiced in accordance with some embodiments.
Figure 10B:
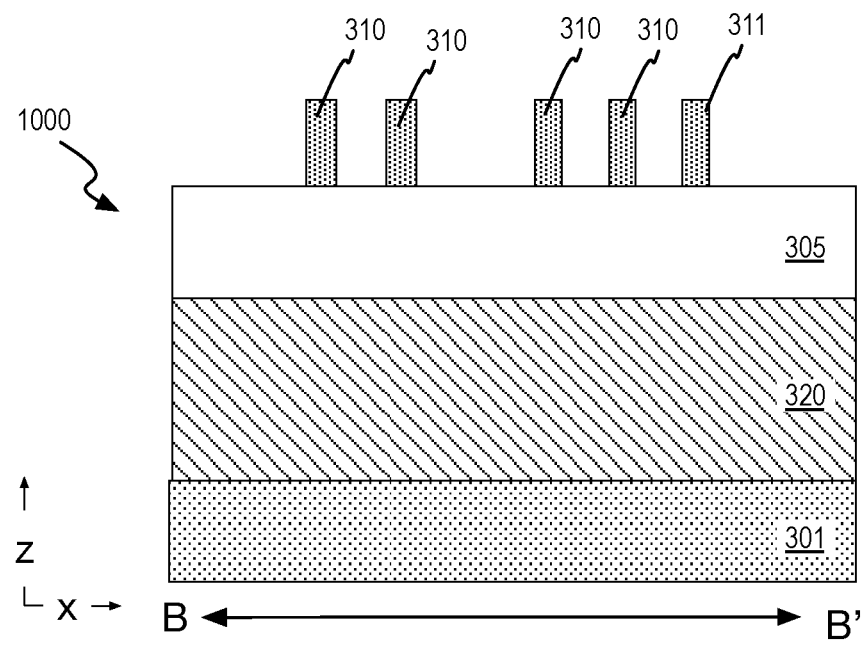
FIGS. 10B, 11B, 12B, 13B, 14B, 15B, 16B and 17B are cross-sectional views of a an IC structure including both nanoribbon transistors and nanowire transistors evolving as operations in the methods illustrated in FIG. 2 are practiced, in accordance with some embodiments.

Referring first to FIGS. 10A and 10B, IC structure 1000 includes a fin mask pattern formed in a first mask layer. IC structure 1000 may be received as an input to methods 201 (FIG. 2), for example. As shown in FIG. 10A, the fin mask pattern has first mask structures including fin masks 310 again having the minimum lateral width W and minimum lateral spacing S, for example substantially as described above for IC structure 300 (FIG. 3A). In IC structure 1000, the fin mask pattern further includes a fin mask 311 that also have the minimum lateral width W, and is spaced apart from an adjacent fin mask 310 by spacing S. Hence, for these exemplary embodiments, all fin masks have the same pitch P. Below the mask layer, the underlayer again includes intervening material layer 305, one or more layers of semiconductor material 320, and substrate 301.

Figure 11A:
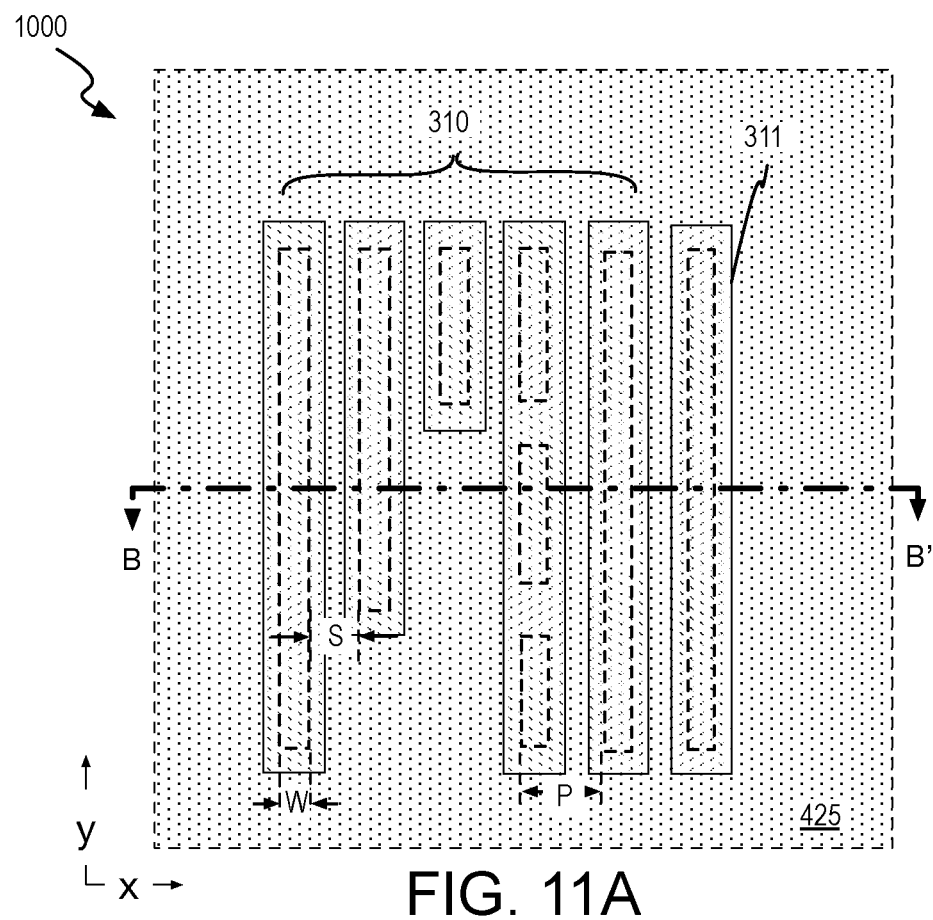
Figure 11B:
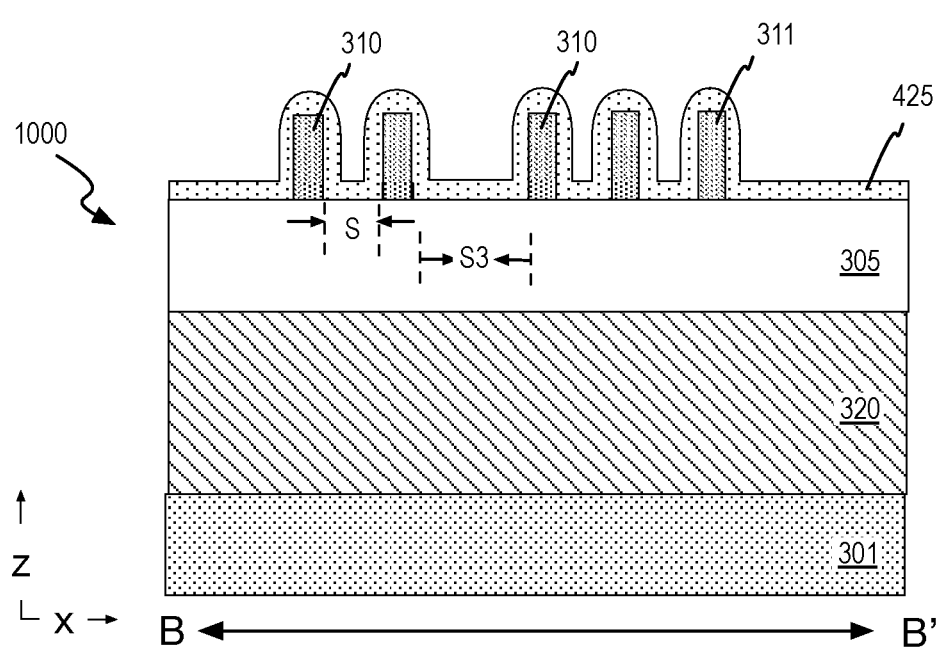

FIGS. 11A and 11B further illustrate a plan and cross-sectional view of IC structure 1000 following deposition of a cap layer 425. Cap layer 425 may be deposited at operation 210 during the practice of methods 201 (FIG. 2), for example. Cap layer 425 may again be any suitable composition, such as any of those described above. As shown in FIGS. 11A and 11B, cap layer 425 covers fin masks 310, 311 and extends over the underlayers (e.g., contacting intervening layer 305) within the spacing S between adjacent fin masks 310, 311. As shown, cap layer 425 is deposited to a nominal thickness that does not fill in the spacing S. Cap layer 425 therefore has thickness $T_1$ within spacing S and sidewall thickness $T_2$ formed over a sidewall of fin masks 310 and 311. In some conformal embodiments, sidewall thickness $T_2$ is equal to thickness $T_1$.

Figure 12A:
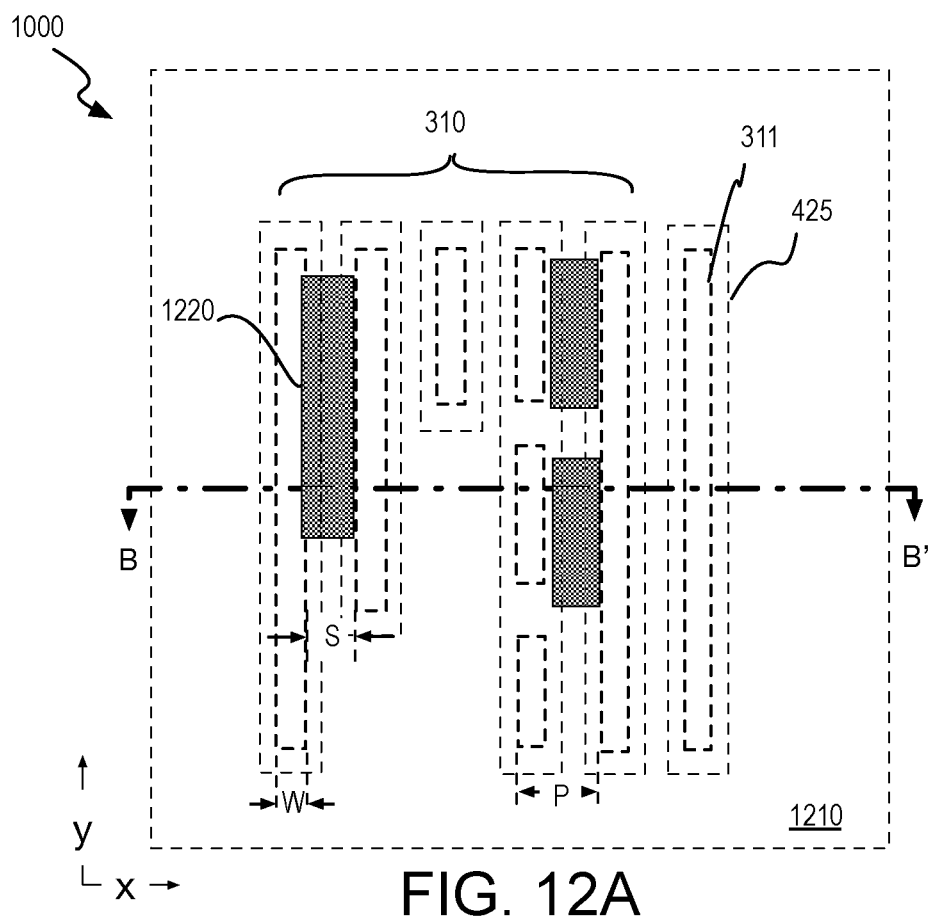
Figure 12B:
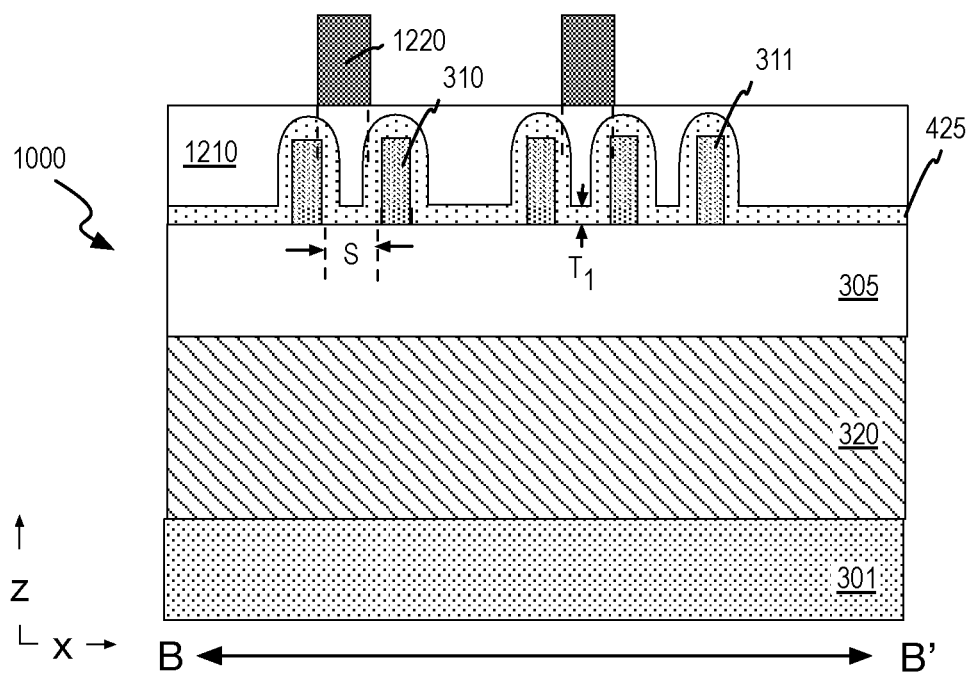

FIGS. 12A and 12B further illustrate a plan and cross-sectional view of IC structure 1000 following deposition of a planarizing gap fill material 1210 and patterning of plug mask structures 1220. Gap fill material 1210 may be deposited at operation 215 during the practice of methods 201, for example. Likewise, plug mask structure 1220 may be formed at operation 220 during the practice of methods 201, for example. As shown in FIGS. 12A and 12B, plug mask structures 1220 are aligned over fin masks 310. Plug mask structures 1220 need only overlap the portion of spacing S where cap layer 425 has thickness $T_1$. Absent cap layer 425, registration to overlap edges of mask features 310 may be significantly more challenging.

Figure 13A:
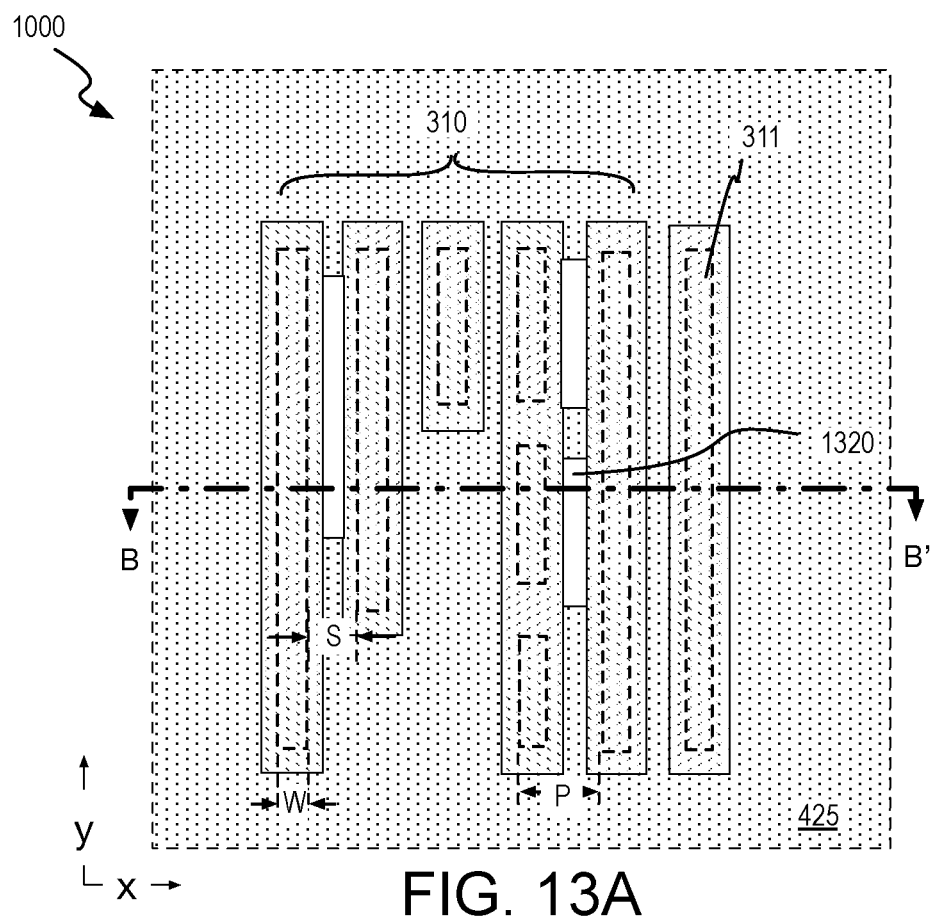
Figure 13B:
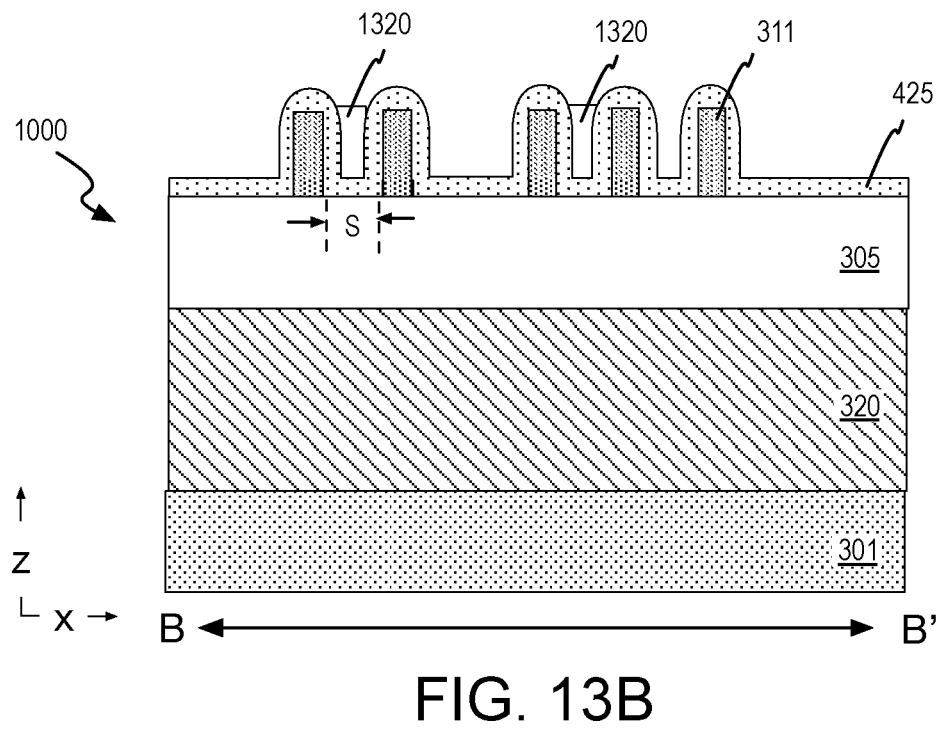

FIGS. 13A and 13B further illustrate a plan and cross-sectional view of IC structure 1000 following an etch of the gap fill material. Such a gap fill patterning may be performed at operation 2255 during the practice of methods 201 (FIG. 2), for example. As shown in FIGS. 13A and 14B, gap fill material 1210 has been removed everywhere except where it was protected by the plug masks (not depicted in FIG. 13A, 13B), leaving only plugs 1320 as residual gap fill material (i.e., gap fill residue). Plugs 1320 supplement cap layer 425 to connect selected fin masks 310, or portions thereof.

Figure 14A:
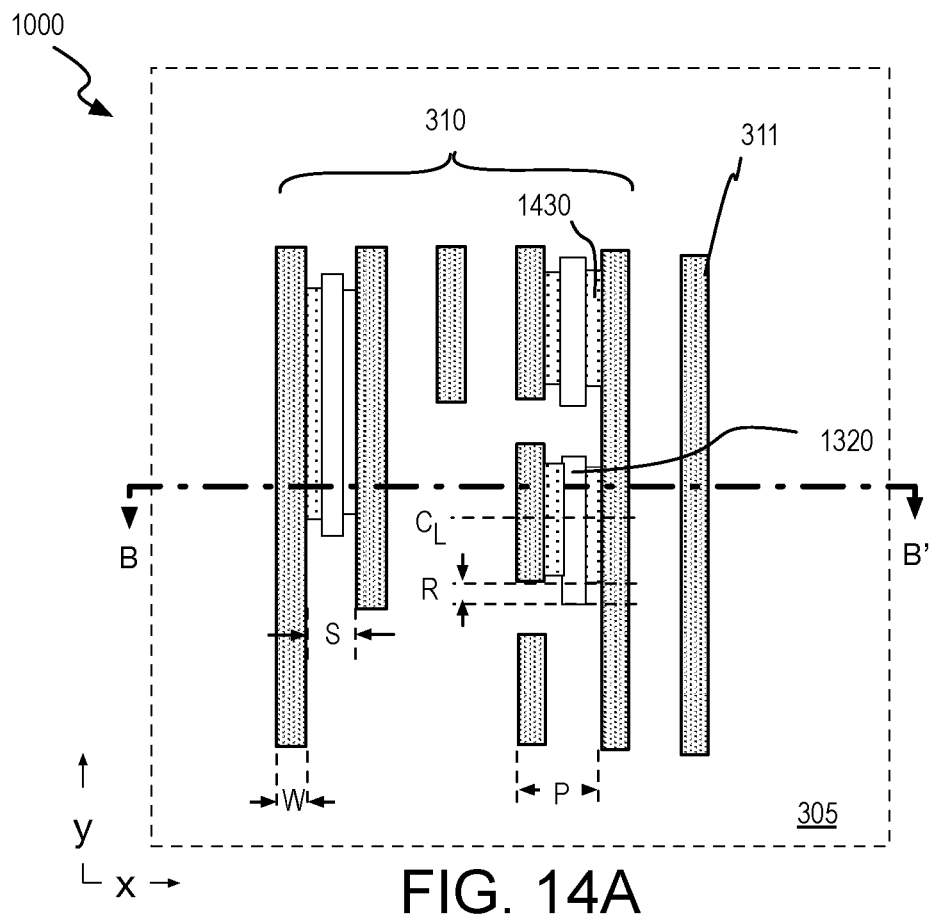
Figure 14B:
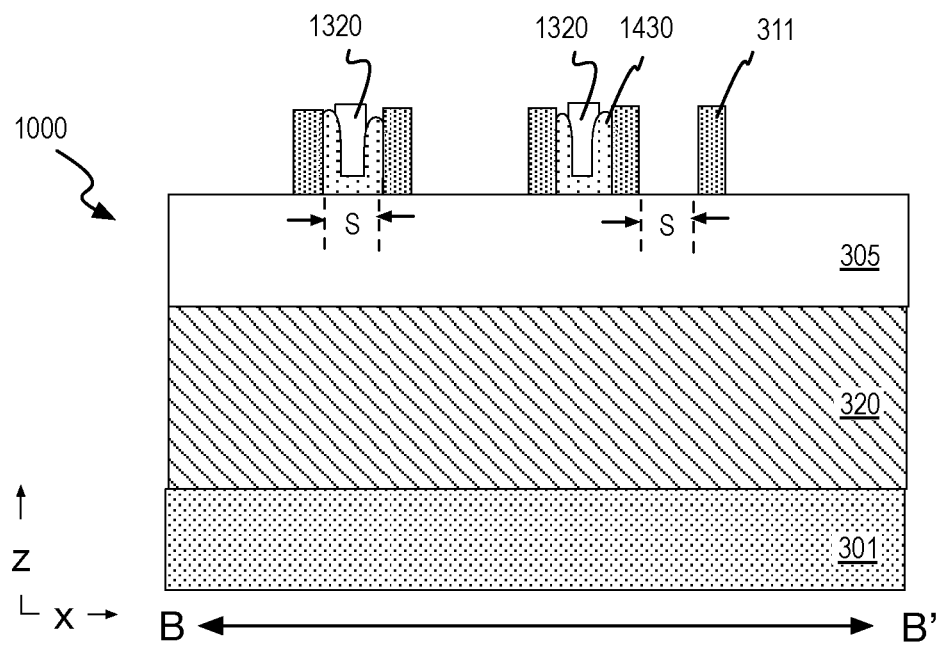

FIGS. 14A and 14B further illustrate a plan and cross-sectional view of IC structure 1000 following an etch of cap layer 425. Such a cap layer etch may be performed at operation 230 during the practice of methods 201 (FIG. 2), for example. As shown in FIGS. 14A and 14B, cap layer 425 has been removed everywhere that was not protected by plugs 1320. In some embodiments, the cap layer etch is selective to the cap layer material relative to plugs 1320. The cap layer etch re-exposes the underlayer (intervening layer 305) and removes the cap material thickness $T_1$ from within spacing S. For advantageous embodiments where the cap layer etch includes an isotropic component, the cap layer etch also removes the sidewall thickness $T_2$ from a sidewall of fin masks 310, 311 that is not protected by one of the plugs 1320. Cap layer residue 530 is retained where protected by plugs 1320. As shown in FIG. 14A, cap layer residue 1430 connects two adjacent fin masks 310 that were separated by spacing S. In the exemplary embodiment illustrated, cap layer residue 1430 suffers a lateral recess R during the cap layer etch. Because of lateral recess R, cap layer residue 1430 is pulled back from the ends of fin masks 310 and also from ends of plugs 1320. Notably, cap layer residue 1430 is self-aligned to plugs 1320, but not to fin masks 310. As such, cap layer residue 1430 may pull back from both (opposite) ends of fin masks 310 by different amounts of lateral recess R. Cap layer residue 1430 is therefore not likely centered with the transverse centerline $C_L$ of the adjacent fin mask 310 having the shortest lateral length. As further shown in FIG. 14A, any of the fin masks 310, 311 that is not adjacent to a plug is etched back to their minimum lateral width W.

Figure 15A:
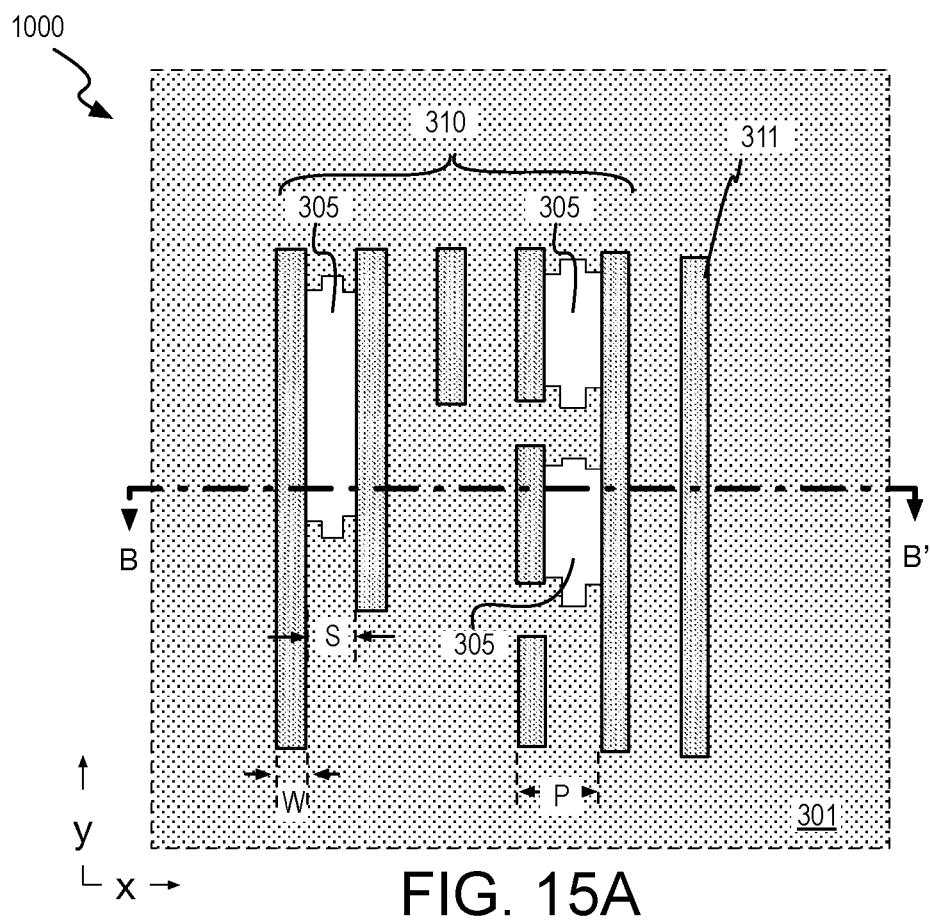
Figure 15B:
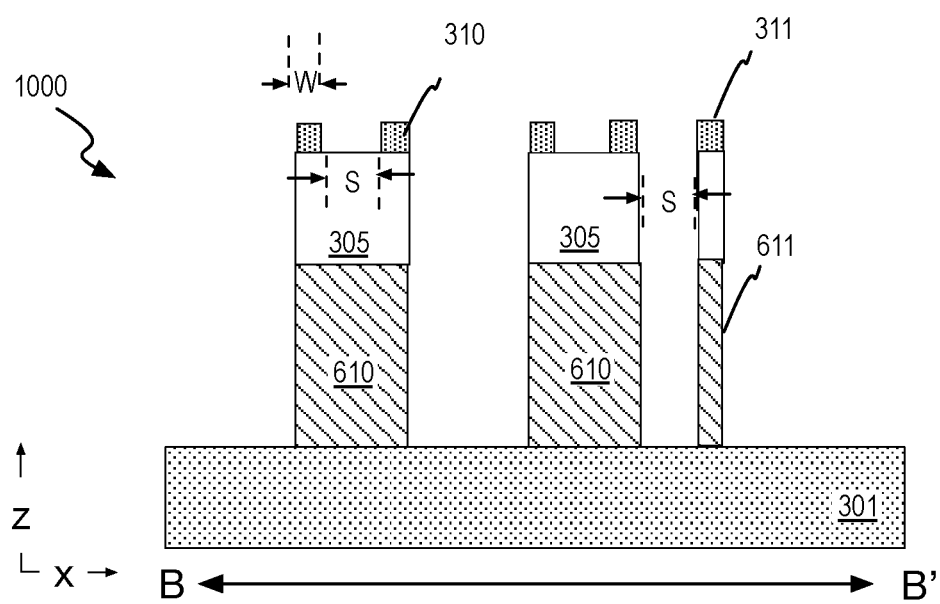

FIGS. 15A and 15B further illustrate a plan and cross-sectional view of IC structure 1000 following patterning of the underlayer based on a summation of the fin masks and cap residue. Such an etch of the underlayer may be performed at operation 140 during the practice of methods 201 (FIG. 2), for example. As shown in FIGS. 15A and 15B, both intervening layer 305 and semiconductor material 320 has been etched anisotropically. Notably, at some point during the underlayer etch, one or more of plugs 1320, cap layer residue 1430 and fin masks 310, 311 may be consumed by the etch process. For this reason, intervening layer 305 may be employed as an additional mask layer for the patterning of semiconductor material 320. In the illustrated example, plugs 1320 and cap layer residue 1430 have both been completely consumed while a residue of fin masks 310, 311 remains. Of course for some embodiments, there may only be a residue of intervening layer 305 remaining following the etch of semiconductor material 320.

Figure 16A:
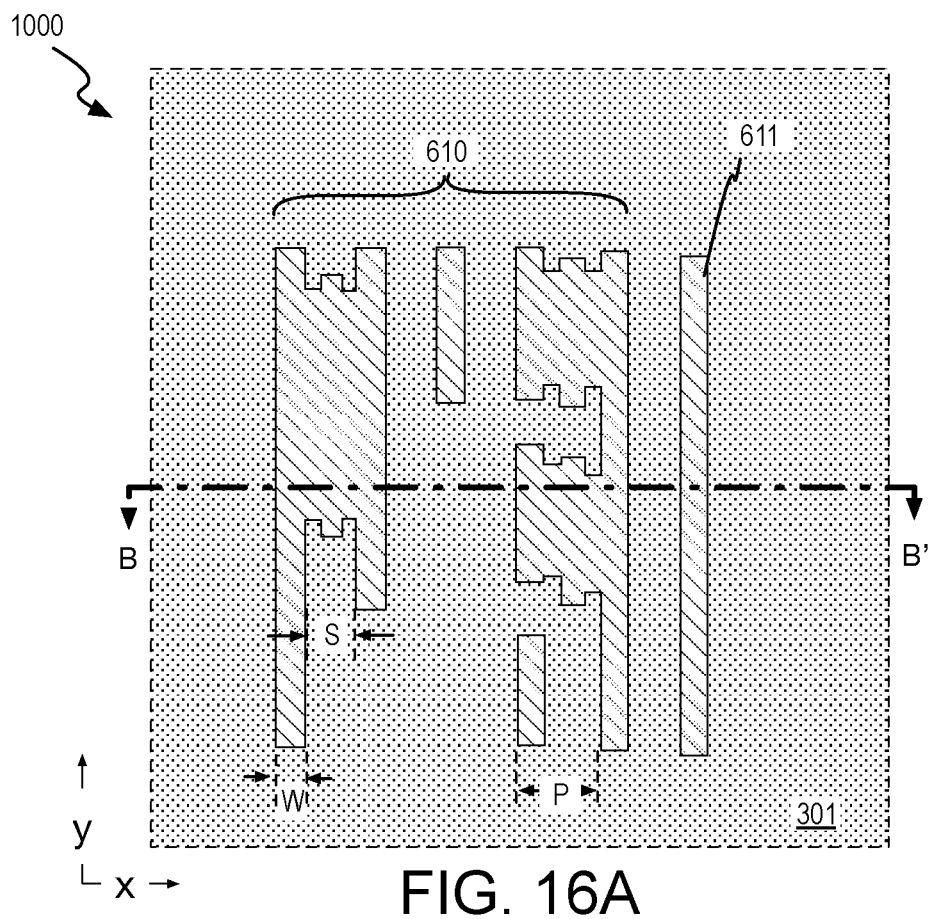
Figure 16B:
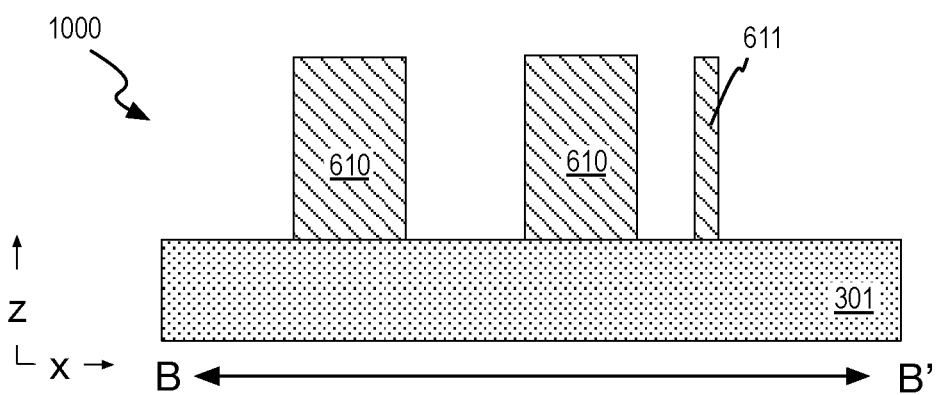

As shown in FIG. 15B, wide fins 610 have outside edges defined based on the external edges of two fin masks 310 that had the minimum lateral width W. Narrow fin 611 has edges defined based on one fin mask 311 that had the minimum lateral width (W). Narrow fin 611 therefore has some minimum lateral width associated with the etch bias (e.g., W for the simplest case where etch bias is zero), while wide fins 610 have a larger lateral width of 2 W+S. FIGS. 16A and 16B further illustrate wide fins that result from the merging of narrow fin masks. In FIGS. 16A and 16B, all mask material has been removed, leaving only wide semiconductor fins 610 and narrow semiconductor fin 611. Hence, with sacrificial mask materials removed, IC structure 1000 includes wide fins 610 that have a number of detents 1650 (visible in the plan view of FIG. 16A) across their lateral width. Detents 1650 correspond to the cap layer recesses R. Hence, for these embodiments the number of detents 1650 is equal to twice the number of spaces between fin masks that were merged by cap layer material masked by a plug. The spacing between adjacent detents 1650 is equal the difference between the minimum lateral spacing S and the cap layer sidewall thickness $T_2$. For embodiments where spacing S is 15-20 nm and the cap layer sidewall thickness $T_2$ is 8-10 nm, the spacing between adjacent detents 1650 is approximately 7-10 nm, and therefore may be approximately equal to the lateral width of narrow fin 611.

Figure 17A:
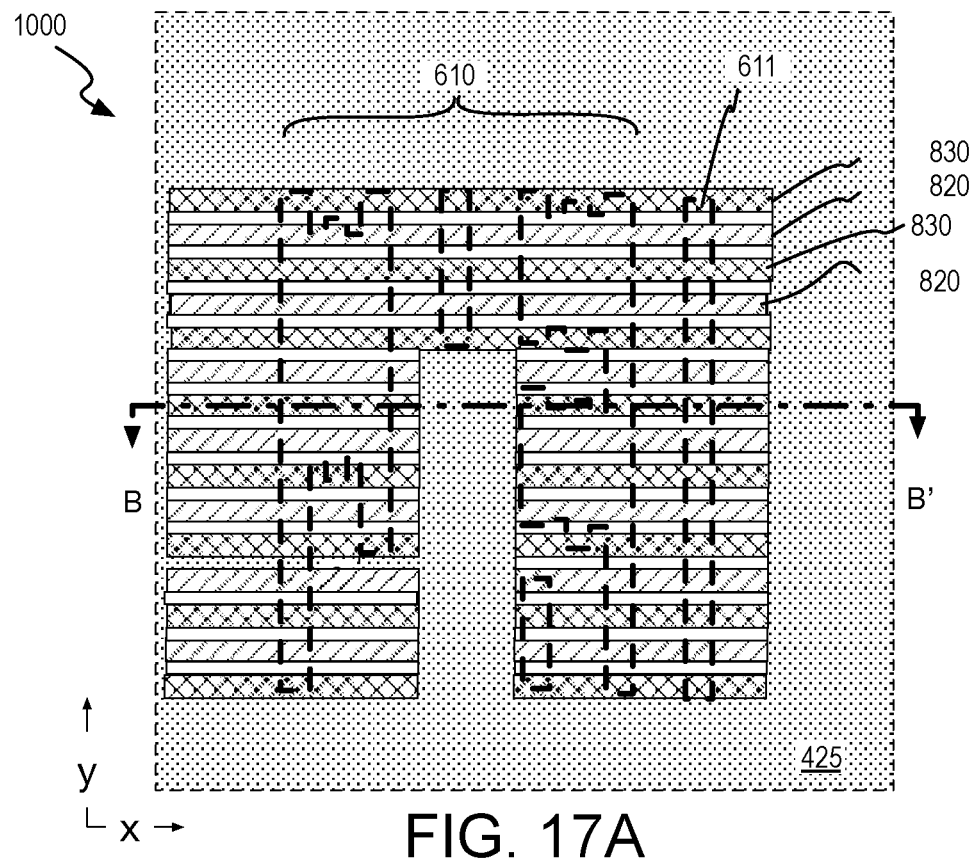
Figure 17B:
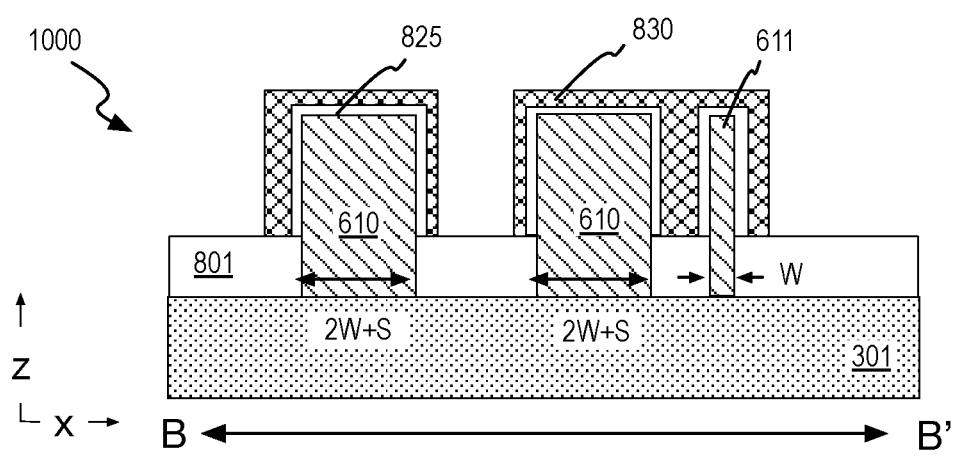

FIGS. 17A and 17B further illustrate a plan and cross-sectional view of IC structure 1000 following fabrication of transistor terminals that couple to the wide and/or narrow semiconductor fins. Such terminal fabrication may entail any known process and may be performed as part of operation 150 during the practice of methods 201 (FIG. 2), for example. As shown in FIGS. 17A and 17B, a gate stack including a gate dielectric 825 and a gate electrode 830 extends over at least a sidewall of the narrow and wide fins 610, 611, landing on an isolation (STI) dielectric 801. As shown in FIG. 17A, source and drain metallization 820 has been formed over the narrow and wide fins 610, 611 on opposite sides of gate electrode 830. In the exemplary embodiment, stripes of gate electrode 830 extend over narrow and wide fins 610, 611 adjacent to stripes of source and drain metallization 820. In FIG. 17A, an outline of wide fins 610 are shown in dashed line. As shown, detents at ends of the wide semiconductor fins may be covered by a dummy gate stack. Detents at the ends of wide semiconductor fins may also be buried within isolation dielectric 801 and/or below other structures, but may nevertheless be identified by one or more analysis techniques (e.g., SEM along a focused ion beam cut).

Depending on where gate electrode 830 and source and drain metallization 820 intersect wide fins 610, a transistor may have a range of lateral widths. For example, while the wide fins 610 shown in FIG. 17B have lateral widths of 2 W+S, the lateral widths of wide fins can again be expected to be an integer multiple of the narrow fin lateral width summed with an integer multiple of the spacing that is merged by the cap layer. The integer multiple of the narrow fin lateral width is at least two. The integer multiple of the spacing is one less than the integer multiple of the narrow fin lateral width (e.g., 2 W+S, 3 W+2 S, 4 W+3 S, 5 W+4 S, etc.). As a further indication of the technique, fins having the minimum lateral width are spaced apart from other fins the spacing S that is merged by the cap layer. Hence, wide fins that are incremented by W+S can be further characterized as incrementing by the pitch of narrow fins.

In some further embodiments, nanoribbon transistors are formed from wide semiconductor fins while nanowire transistors are formed from narrow semiconductor fins. The IC structure 1000, for example, may include two or more layers of semiconductor material with a sidewall of each of layer defining edges of the fin. In addition to being adjacent to a sidewall of the layers of semiconductor material, the gate stack may also extend between two layers of semiconductor material. For example, a nanoribbon transistor may include two or more wide fin layers of a suitable semiconductor material (e.g., Si, Ge, etc.). A gate stack including a gate dielectric and a gate electrode may pass between wide fin layers (and may further wrap around a channel portion of each layer). Likewise, a nanowire transistor may include two or more narrow fin layers of a suitable semiconductor material (e.g., Si, Ge, etc.). A gate stack including a gate dielectric and a gate electrode may pass between the narrow fin layers (and may further wrap around a channel portion of each layer).

In view of the above description, it will be appreciated that the technique of merging narrow mask features to dimensionally scale geometries while providing structures of multiple lateral widths may be readily applied one or more times in an IC fabrication process, for example at one or more interconnect levels in addition to one or more semiconductor levels.

Figure 18:
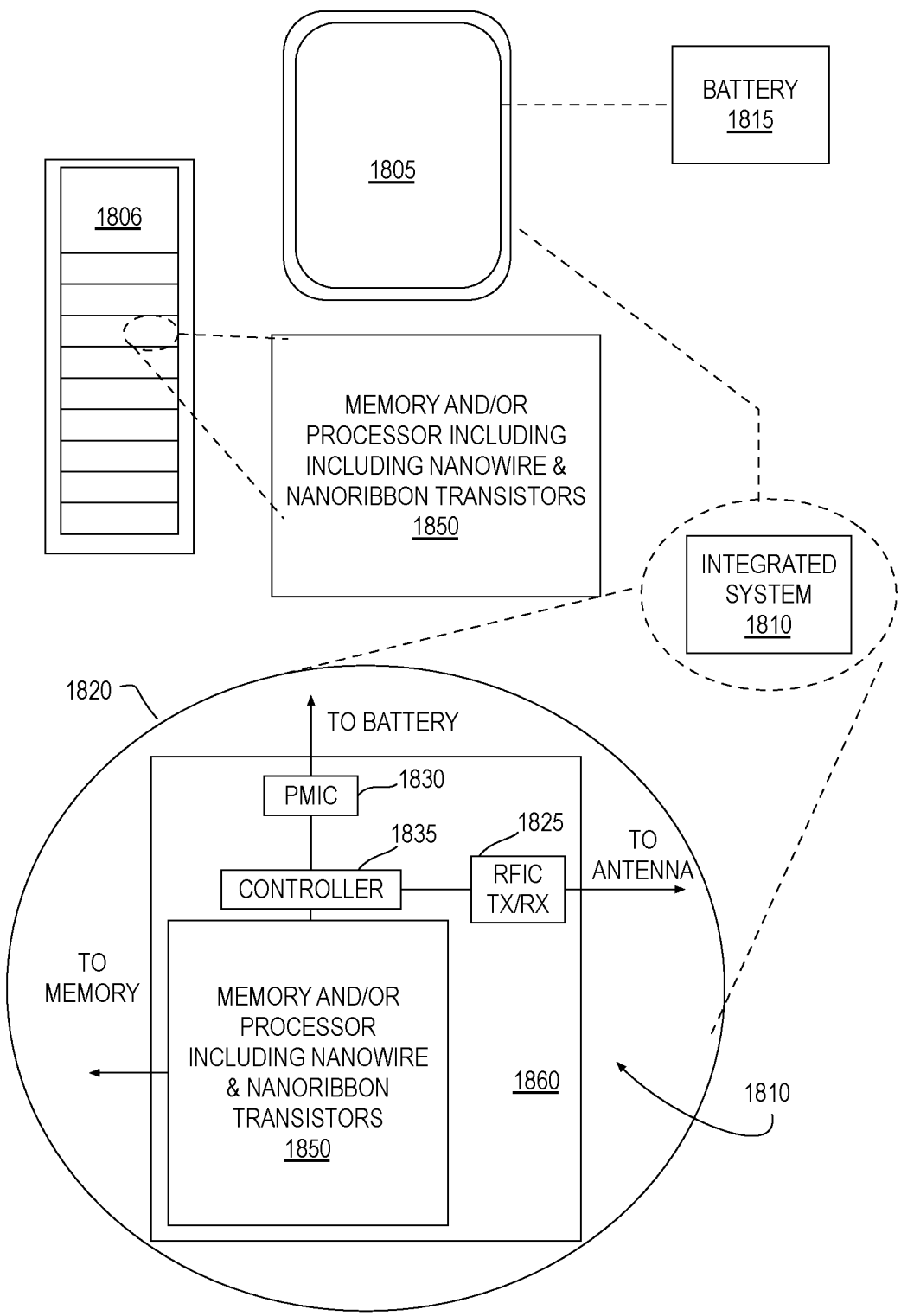
FIG. 18 illustrates a mobile computing platform and a data server machine employing an IC including nanowire and nanoribbon transistors, in accordance with some embodiments.

FIG. 18 illustrates a mobile computing platform and a data server machine employing an IC including dimensionally scaled dual-damascene interconnect structures, for example including plugged conductive traces having one or more dielectric plugs and conductive vias in accordance with embodiments described herein. The server machine 1806 may be any commercial server, for example including any number of high-performance computing platforms disposed within a rack and networked together for electronic data processing, which in the exemplary embodiment includes a packaged monolithic SoC 1850. The mobile computing platform 1805 may be any portable device configured for each of electronic data display, electronic data processing, wireless electronic data transmission, or the like. For example, the mobile computing platform 1805 may be any of a tablet, a smart phone, laptop computer, etc., and may include a display screen (e.g., a capacitive, inductive, resistive, or optical touchscreen), a chip-level or package-level integrated system 1810, and a battery 1815.

Either disposed within the integrated system 1810 illustrated in the expanded view 1820, or as a stand-alone packaged chip within the server machine 1806, monolithic SoC 1850 includes a memory circuitry block (e.g., RAM), a processor circuitry block (e.g., a microprocessor, a multi-core microprocessor, graphics processor, or the like), either or both of which include dimensionally scaled dual-damascene interconnect structures (e.g., including plugged conductive traces having one or more dielectric plugs and conductive vias) in accordance with embodiments described herein. The monolithic SoC 1850 may be further coupled to a board, a substrate, or an interposer 1860 along with, one or more of a power management integrated circuit (PMIC) 1830, RF (wireless) integrated circuit (RFIC) 1825 including a wideband RF (wireless) transmitter and/or receiver (TX/RX) (e.g., including a digital baseband and an analog front end module further comprises a power amplifier on a transmit path and a low noise amplifier on a receive path), and a controller 1835. Any or all of RFIC 1825 and PMIC 1830 may also include dimensionally scaled dual-damascene interconnect structures, for example including plugged conductive traces having one or more dielectric plugs and conductive vias in accordance with embodiments described herein.

Functionally, PMIC 1830 may perform battery power regulation, DC-to-DC conversion, etc., and so has an input coupled to battery 1815 and with an output providing a current supply to other functional modules. As further illustrated, in the exemplary embodiment, RFIC 1825 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond. Notably, each of these board-level IC modules 1825, 1830, 1835 may be integrated onto separate ICs or integrated into monolithic SoC 1850.

Figure 19:
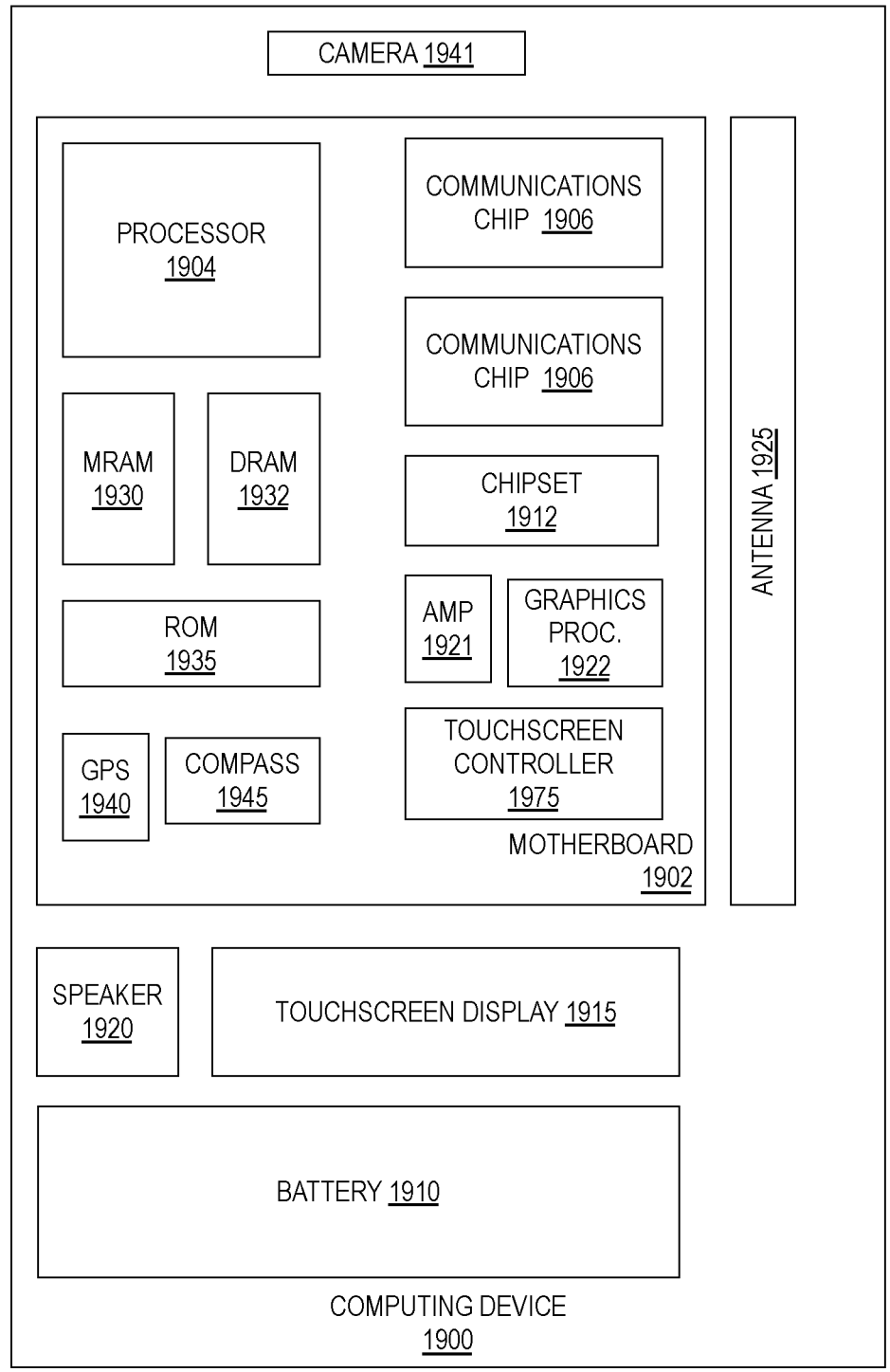
FIG. 19 is a functional block diagram of an electronic computing device, in accordance with some embodiments.

FIG. 19 is a functional block diagram of an electronic computing device 1900, in accordance with some embodiments. Computing device 1900 may be found inside platform 1805 or server machine 1806, for example. Device 1900 further includes a motherboard 1902 hosting a number of components, such as, but not limited to, a processor 1904 (e.g., an applications processor), which may further incorporate nanowire and nanoribbon transistors, for example in accordance with embodiments described herein. Processor 1904 may be physically and/or electrically coupled to motherboard 1902. In some examples, processor 1904 includes an integrated circuit die packaged within the processor 1904. In general, the term "processor" or "microprocessor" may refer to any device or portion of a device that processes electronic data from registers and/or memory to transform that electronic data into other electronic data that may be further stored in registers and/or memory.

In various examples, one or more communication chips 1906 may also be physically and/or electrically coupled to the motherboard 1902. In further implementations, communication chips 1906 may be part of processor 1904. Depending on its applications, computing device 1900 may include other components that may or may not be physically and electrically coupled to motherboard 1902. These other components include, but are not limited to, volatile memory (e.g., MRAM 1930, DRAM 1932), non-volatile memory (e.g., ROM 1935), flash memory, a graphics processor 1922, a digital signal processor, a crypto processor, a chipset, an antenna 1925, touchscreen display 1915, touchscreen controller 1975, battery 1910, audio codec, video codec, power amplifier 1921, global positioning system (GPS) device 1940, compass 1945, accelerometer, gyroscope, audio speaker 1920, camera 1941, and mass storage device (such as hard disk drive, solid-state drive (SSD), compact disk (CD), digital versatile disk (DVD), and so forth), or the like.

Communication chips 1906 may enable wireless communications for the transfer of data to and from the computing device 1900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1906 may implement any of a number of wireless standards or protocols, including but not limited to those described elsewhere herein. As discussed, computing device 1900 may include a plurality of communication chips 1906. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that principles of the disclosure are not limited to the embodiments so described, but can be practiced with modification and alteration without departing from the scope of the appended claims. For example the above embodiments may include specific combinations of features as further provided below.

In one or more first examples, an integrated circuit (IC) structure includes a first plurality of transistors, ones of the first plurality including one or more layers of semiconductor material having a first lateral width of all transistors within the IC, the layers of semiconductor material separated from semiconductor layers of an adjacent transistor by at least a first spacing. The IC structure includes a second plurality of transistors, ones of the second plurality including one or more layers of semiconductor material having a lateral width that is equal to a first integer multiple of the first lateral width summed with a second integer multiple of a predetermined distance that is less than, or equal to, the first spacing, wherein the first integer is at least two, and the second integer is one less than the first integer.

In one or more second examples, for any of the first examples the predetermined distance is less than the first spacing.

In one or more third examples, for any of the first or second examples the first lateral width is a nominal minimum lateral width of all transistors within the IC.

In one or more fourth examples, for any of the first through third examples the second plurality comprises a first transistor including one or more layers of semiconductor material having a lateral width that is equal to twice the first lateral width summed with the predetermine distance, and a second transistor including one or more layers of semiconductor material having a lateral width that is equal to three times the first lateral width summed with twice the predetermined distance.

In one or more fifth examples, for any of the first through the fourth examples the predetermined distance is less than the first spacing. Ones of the second plurality include one or more layers of semiconductor material with opposite ends that define a lateral length. The opposite ends have a number of detents across the lateral width, wherein the number of detents are equal to the second integer, and the detents have a spacing from each other equal to the first lateral width.

In one or more sixth examples, for any of the fifth examples the detents are symmetric about a transverse centerline through individual ones of the second plurality of transistors.

In one or more seventh examples, for any of the first through the sixth examples, the predetermined distance is equal to the first spacing. Ones of the second plurality include one or more layers of semiconductor material with opposite ends that define a lateral length. The opposite ends have a number of detents across the lateral width, wherein the number of detents is equal to twice the second integer, and the detents have a spacing from each other that is less than the predetermined distance.

In one or more eighth examples, for any of the first through the seventh examples every transistor in the IC is either one of the first plurality of transistors or one of the second plurality of transistors.

In one or more ninth examples, for any of the first through the eighth examples the first lateral width is no more than 10 nm, and the first spacing is no more than 20 nm.

In one or more tenth examples, for any of the first through the ninth examples the first plurality of transistors are nanowire transistors and the second plurality of transistors are nanoribbon transistors, individual ones of which comprise a gate stack adjacent to a sidewall of at least two layers of semiconductor material and located between the two layers, wherein the gate stack includes a gate dielectric layer and a gate electrode material, and a source and a drain coupled to the two layers of semiconductor material on opposite sides of the gate stack.

In one or more eleventh examples, an integrated circuit (IC) device includes a plurality of nanowire transistors, ones of the nanowire transistors including one or more layers of semiconductor material having a first lateral width of all transistors within the IC, and the layers of semiconductor material separated from semiconductor layers of an adjacent transistor by at least a first spacing. The IC includes a plurality of nanoribbon transistors, ones of the nanoribbon transistors including one or more layers of semiconductor material having a second lateral width that is equal to a first integer multiple of the first lateral width summed with a second integer multiple of a predetermined distance that is less than, or equal to, the first spacing. The first integer is at least two. The second integer is one less than the first integer. Ones of the nanoribbon transistors include one or more layers of semiconductor material with opposite ends that define a lateral length, and the opposite ends have a number of detents across the lateral width. The number of detents is equal to the second integer or equal to twice the second integer.

In one or more twelfth examples, for any of the eleventh examples the predetermined distance is less than the first spacing, the number of detents is equal to the second integer, the detents have a spacing from each other equal to the first lateral width, and the detents are symmetric about a transverse centerline through individual ones of the nanoribbon transistors.

In one or more thirteenth examples, for any of the eleventh or twelfth embodiments the predetermined distance is equal to the first spacing, the number of detents is equal to twice the second integer, and the detents have a spacing from each other that is less than the predetermined distance.

In one or more fourteenth examples, a computer platform includes a data storage means to store data, and a data processing means coupled to the data storage means. The data processing means includes the IC structure of any one of examples one through nine.

In one or more fifteenth examples, the computer platform further includes a battery coupled to the data processing means, and a wireless communication means coupled to the data processing means.

In one or more sixteenth examples, a method of fabricating an integrated circuit (IC) structure includes receiving a workpiece with a fin mask pattern in a first mask layer, the fin mask pattern comprising a plurality of fins of a first lateral width, and first fins of the fin mask pattern separated by a first spacing, and a second fins of the fin mask pattern separated by a second spacing. The method includes depositing a cap layer over the fin mask pattern, the cap layer covering sidewalls of the first and second fins with a thickness of cap layer material. The method includes removing the cap layer from between the first fins while retaining residual cap layer material between the second fins. The method includes patterning a material layer under the first mask layer based on the fin mask pattern and residual cap layer material.

In one or more seventeenth examples, for any of the sixteenth examples patterning the material layer further comprises translating the first fins of the fin mask pattern into first fins of one or more semiconductor layers having the first lateral width. Pattering the material layer further comprises translating a merged pattern comprising the second fins of the fin mask pattern and the residual cap layer material between the second fins into a second fin of one or more semiconductor layers having a second lateral width that is equal to a first integer multiple of the first lateral width summed with a second integer multiple of the second spacing.

In one or more eighteenth examples, for any of the sixteenth through seventeenth examples the cap layer thickness deposited on the sidewalls of the second fins is less than half the second spacing, and the second spacing is equal to the first spacing, and the method further comprises patterning a plug over the cap layer, the plug contacting at least the cap layer covering sidewalls of two adjacent ones of the second fins, and removing the cap layer from between the first fins while retaining residual cap layer material between the second fins further comprises retaining only residual cap layer material that is protected by the plug.

In one or more nineteenth examples, for any of the eighteenth examples patterning the plug further comprises depositing a gap fill material over the cap layer, lithographically patterning a plug mask over the gap fill material, wherein the plug mask has edges overlapping the at least the cap layer covering sidewalls of two adjacent ones of the second fins, and removing the gap fill material unprotected by the plug mask from over the cap layer.

In one or more twentieth examples, for any of the sixteenth through nineteenth examples, the second spacing is less than the first spacing and the cap layer thickness deposited on the sidewalls of the second fins is equal to at least half the second spacing.

In one or more twenty-first examples, for any of the sixteenth through nineteenth examples the first lateral width is a nominal minimum lateral width of all transistors within the IC.

In one or more twenty-second examples, for any of the sixteenth through nineteenth examples depositing the cap layer further comprises conformally depositing a material non-selectively over the first mask layer. Removing the cap layer further comprises isotropically etching through the thickness of the cap layer. Patterning the material layer under the first mask layer comprises anisotropically etching one or more layers of semiconductor material unprotected by the fin pattern and residual cap layer material.

In one or more twenty-third examples, for any of the twentieth-second examples the method further includes forming a gate stack adjacent to a sidewall of at least two layers of semiconductor material and located between the two layers, wherein the gate stack includes a gate dielectric layer and a gate electrode material. The method further includes forming a source and a drain coupled to the two layers of semiconductor material on opposite sides of the gate stack.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) structure, comprising:
a first plurality of transistors, individual ones of the first plurality including one or more layers of semiconductor material having a first lateral width, the layers of semiconductor material separated from semiconductor layers of an adjacent one of the first plurality of transistors by at least a first spacing; and
a second plurality of transistors, individual ones of the second plurality including one or more layers of semiconductor material having a second lateral width that is equal to a first integer multiple of the first lateral width summed with a second integer multiple of a predetermined distance that is less than, or equal to, the first spacing, wherein:
the first integer is at least two; and
the second integer is one less than the first integer.

2. The IC structure of claim 1, wherein the predetermined distance is less than the first spacing.

3. The IC structure of claim 1, wherein the first lateral width is a nominal minimum lateral width of all transistors within the IC.

4. The IC structure of claim 3, wherein:
the minimum nominal lateral width is no more than 10 nm; and
the first spacing is no more than 20 nm.

5. The IC structure of any one of claim 1, wherein the second plurality of transistors comprises:
a first transistor including one or more layers of semiconductor material having a lateral width that is equal to twice the first lateral width summed with the predetermined distance; and
a second transistor including one or more layers of semiconductor material having a lateral width that is equal to three times the first lateral width summed with twice the predetermined distance.

6. The IC structure of claim 1, wherein:
the predetermined distance is less than the first spacing;
individual ones of the second plurality of transistors include one or more layers of semiconductor material with opposite ends that define a lateral length; and
the opposite ends have a number of detents across the lateral width, wherein the number of detents is equal to the second integer, and the detents have a spacing from each other equal to the first lateral width.

7. The IC structure of claim 6, wherein the detents are symmetric about a transverse centerline through individual ones of the second plurality of transistors.

8. The IC structure of claim 1, wherein:
the predetermined distance is equal to the first spacing;
ones of the second plurality of transistors include one or more layers of semiconductor material with opposite ends that define a lateral length; and
the opposite ends have a number of detents across the lateral width, wherein the number of detents is equal to twice the second integer, and the detents have a spacing from each other that is less than the predetermined distance.

9. The IC structure of claim 1, wherein every transistor in the IC is either one of the first plurality of transistors or one of the second plurality of transistors.

10. The IC structure of claim 1, wherein:
the first plurality of transistors are nanowire transistors and the second plurality of transistors are nanoribbon transistors, individual ones of which comprise:
a gate stack adjacent to a sidewall of at least two layers of semiconductor material and located between the two layers, wherein the gate stack includes a gate dielectric layer and a gate electrode material; and
a source and a drain coupled to the two layers of semiconductor material on opposite sides of the gate stack.

11. An integrated circuit (IC) device, comprising:
a plurality of nanowire transistors, individual ones of the nanowire transistors including one or more layers of semiconductor material having a first lateral width, and the layers of semiconductor material separated from semiconductor layers of an adjacent one of the nanowire transistors by at least a first spacing; and
a plurality of nanoribbon transistors, individual ones of the nanoribbon transistors including one or more layers of semiconductor material having a second lateral width that is equal to a first integer multiple of the first lateral width summed with a second integer multiple of a predetermined distance that is less than, or equal to, the first spacing, wherein:
the first integer is at least two;
the second integer is one less than the first integer;
individual ones of the nanoribbon transistors include one or more layers of semiconductor material with opposite ends that define a lateral length; and
the opposite ends have a number of detents across the lateral width, wherein the number of detents is equal to the second integer, or equal to twice the second integer.

12. The IC device of claim 11, wherein:
the predetermined distance is less than the first spacing;
the number of detents is equal to the second integer;
the detents have a spacing from each other equal to the first lateral width; and
the detents are symmetric about a transverse centerline through individual ones of the nanoribbon transistors.

13. The IC device of claim 11, wherein:
the predetermined distance is equal to the first spacing;
the number of detents is equal to twice the second integer; and
the detents have a spacing from each other that is less than the predetermined distance.

14. A method of fabricating an integrated circuit (IC) structure, comprising:
receiving a workpiece with a fin mask pattern in a first mask layer, the fin mask pattern comprising a plurality of fins of a first lateral width, and first fins of the fin mask pattern separated by a first spacing and a second fins of the fin mask pattern separated by a second spacing;
depositing a cap layer over the fin mask pattern, the cap layer covering sidewalls of the first and second fins with a thickness of cap layer material;
removing the cap layer from between the first fins while retaining residual cap layer material between the second fins; and
patterning a material layer under the first mask layer based on the fin mask pattern and residual cap layer material.

15. The method of claim 14, wherein patterning the material layer further comprises:
translating the first fins of the fin mask pattern into first fins of one or more semiconductor layers having the first lateral width; and
translating a merged pattern comprising the second fins of the fin mask pattern and the residual cap layer material between the second fins into a second fin of one or more semiconductor layers having a second lateral width that is equal to a first integer multiple of the first lateral width summed with a second integer multiple of the second spacing.

16. The method of claim 15, wherein the cap layer thickness deposited on the sidewalls of the second fins is less than half the second spacing, and the second spacing is equal to the first spacing, and the method further comprises:
patterning a plug over the cap layer, the plug contacting at least the cap layer covering sidewalls of two adjacent ones of the second fins; and
wherein removing the cap layer from between the first fins while retaining residual cap layer material between the second fins further comprises retaining only residual cap layer material that is protected by the plug.

17. The method of claim 16, wherein patterning the plug further comprises:
depositing a gap fill material over the cap layer;
lithographically patterning a plug mask over the gap fill material, wherein the plug mask has edges overlapping at least the cap layer covering sidewalls of two adjacent ones of the second fins; and
removing the gap fill material unprotected by the plug mask from over the cap layer.

18. The method of claim 14, wherein the second spacing is less than the first spacing and the cap layer thickness deposited on the sidewalls of the second fins is equal to at least half the second spacing.

19. The method of claim 14, wherein the first lateral width is a nominal minimum lateral width of all transistors within the IC.

20. The method of claim 14, wherein:
depositing the cap layer further comprises conformally depositing a material non-selectively over the first mask layer;
removing the cap layer further comprises isotropically etching through the thickness of the cap layer; and
patterning the material layer under the first mask layer comprises anisotropically etching one or more layers of semiconductor material unprotected by the fin mask pattern and residual cap layer material.

21. The method of claim 20, further comprising:
forming a gate stack adjacent to at least a sidewall of two layers of semiconductor material and located between the two layers, wherein the gate stack includes a gate dielectric layer and a gate electrode material; and
forming a source and a drain coupled to the two layers of semiconductor material on opposite sides of the gate stack.

* * * * *